(12) United States Patent
Du

(10) Patent No.: US 8,148,979 B1
(45) Date of Patent: Apr. 3, 2012

(54) SELECTIVE MAGNETIC RESONANCE IMAGING

(75) Inventor: Jiang Du, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 195 days.

(21) Appl. No.: 12/425,350

(22) Filed: Apr. 16, 2009

Related U.S. Application Data

(60) Provisional application No. 61/045,496, filed on Apr. 16, 2008.

(51) Int. Cl.
*G01V 3/00* (2006.01)
(52) U.S. Cl. ............................... 324/307; 324/312
(58) Field of Classification Search .............. 324/307, 324/309, 312
See application file for complete search history.

(56) References Cited

U.S. PATENT DOCUMENTS

| 7,288,936 | B2 * | 10/2007 | Larson et al. ............ 324/307 |
| 2007/0255129 | A1 | 11/2007 | Du et al. |
| 2007/0255130 | A1 | 11/2007 | Du |

OTHER PUBLICATIONS

Balchandani, P. et al., "Slice-selective tunable-flip adiabatic low peak-power excitation pulse," Magn. Reson. Med. 59:1072-1078 (2008).
Bergin, C.J. et al., "Lung parenchyma: projection reconstruction imaging," Radiology 179: 777-781 (1991).
Blumenkrantz G., "A pilot, two-year longitudinal study of the interrelationship between trabecular bone and articular cartilage in the osteoarthritic knee," Osteoarthritis and Cartilage 12:997-1005 (2004).
Bottomley, P.A., "Spatial localization in NMR spectroscopy in vivo," Ann NY Acad Sci 508:333-348 (1987).
Brittain, J.H. et al., "Ultra-Short TE imaging with single-digit (8 microsecond) TE," Proceedings of the 11th Annual Meeting of ISMRM, Kyoto, Japan, 2004, p. 629.
Brossmann J. et al., "Short echo time projection reconstruction MR imaging of cartilage: comparison with fat-suppressed spiled GRASS and magnetization transfer contrast MR imaging," Radiology 203:501-507 (1997).
Burr, D.B., "Anatomy and physiology of the mineralized tissues: role in the pathogenesis of osteoarthrosis," Osteoarthritis and Cartilage 12: S20-S30 (2004).
Conolly, S. et al., "Variable-rate selective excitation," J Magn Reson 78:440-458 (1988).
Donohue, J.M., "The effects of indirect blunt trauma on adult canine articular cartilage," The Journal of Bone and Joint Surgery 65:948-957 (1983).
Du, J. et al., "Enhanced Peripheral Magnetic Resonance Angiography Using Time-Resolved Vastly Undersampled Isotropic Projection Reconstruction," Journal of Magnetic Resonance in Imaging 20:894-900 (2004).
Du, J. et al., "Time-resolved, undersampled projection reconstruction imaging for high resolution CE-MRA of the distal runoff vessels," Magnetic Resonance in Medicine 48:516-522 (2002).
Du, J. et al., "Ultrashort TE spectroscopic imaging (UTESI) of cortical bone," Magnetic Resonance in Medicine 58:1001-1009 (2007).

(Continued)

*Primary Examiner* — Louis Arana
(74) *Attorney, Agent, or Firm* — Perkins Coie LLP

(57) ABSTRACT

Techniques and systems for magnetic resonance imaging are disclosed in this specification. In one aspect, imaging of tissues having short transverse relaxation times T2 is described including short echo time (TE) signal acquisition preceded by suppression of signal from the surrounding tissues having long transverse relaxation times T2, to increase the contrast and dynamic range of magnetic resonance (MR) images contributed by the tissues having short T2.

24 Claims, 14 Drawing Sheets

OTHER PUBLICATIONS

Du, J. et al., "Ultrashort TE (UTE) spectroscopic imaging of cortical bone using a variable TE acquisition and sliding window reconstruction," Proceedings of the 15th Annual Meeting of ISMRM, Berlin, Germany, 2007, p. 421.

Du, J. et al., "Multi-echo ultrashort TE (UTE) imaging and T2* mapping of knee cartilage," Proceedings of the 14th Annual Meeting of ISMRM, Seattle, USA, 2006, p. 57.

Du J. et al., "Ultrashort TE9UTE) Imaging of the Cortical Bone at 3T," Proceedings of the 15th Annual Meeting of International Society for Magnetic Resonance in Medicine (ISMRM), Berlin, Germany, May 19-25, 2007, p. 381.

Du et al., "Two dimensional ultrashort echo time imaging using a spiral trajectory" Magn. Reson Imaging 26: 304-312 (2008).

Eckstein F. et al., "Quantitative MRI of cartilage and bone: degenerative changes in osteoarthritis," NMR in Biomedicine 19:822-854 (2006).

Felson D.T. et al., "Osteoarthritis: new insights. Part 1: the disease and its risk factors," Ann Intern Med 133: 635-646 (2000).

Ferguson, V.L. et al., "Nanomechanical properties and mineral concentration in articular calcified cartilage and subchondral bone," J. Anat. 203:191-202 (2003).

Fullerton, G.D. and A. Rahal, "Collagen structure: the molecular source of the tendon magic angle effect," Journal of Magnetic Resonance Imaging 25:345-361 (2007).

Gatehouse, P.D. and G.M. Bydder, "Magnetic resonance imaging of short $T_2$ components in tissues," Clinical Radiology 58:1-19 (2003).

Gatehouse, P.D. et al., "Contrast-enhanced MRI of the menisci of the knee using ultrashort echo time (UTE) pulse sequences: imaging of the red and white zones," The British Journal of Radiology 77:641-647 (2004).

Gatehouse, P.D. et al., "Magnetic resonance imaging of the knee with ultrashort TE (UTE) pulse sequences," Magn Reson Imaging 22:1061-1067 (2004).

Gold G.E. et al., "MR spectroscopic imaging of collagen: tendons and knee menisci," Magn Reson Med 34(5): 647-654 (1995).

Gold, G.E. et al., "MR imaging of articular cartilage of the knee: new methods using ultrashort TEs,". AJR 170:1223-1226 (1998).

Gold, G.E. et al., "Musculoskeletal MRI at 3.0T: relaxation times and image contrast," AJR 183: 343-351 (2004).

Josan, S. et al., "Double half RF pulse for reduced sensitivity to linear eddy currents in ultrashort T2 imaging," Proceedings of the 14th Annual Meeting of ISMRM, Seattle, USA, 2006, p. 3004.

Joseph, P.M. and J. Whitley, "Experimental simulation evaluation of ECG-gated heart scans with a small number of views," Med Phys 10:444-449 (1983).

Larson, P.E. et al., "Designing lng-T2 supression pulses for ultrashort echo time imaging." Magn. Reson. Med. 6:94-103 (2006).

Larson, P.E. et al., "Using adiabatic inversion pulses for long-$T_2$ suppression in ultrashort echo time (UTE) imaging," Magn. Reson. Med. 58: 952-961 (2007).

Li, B.H. et al., "The electron miscroscope appearance of the subchondral bone plate in the human femoral head in osteoarthritis and osteoporosis," J. Anat. 195:101-110 (1999).

Martel-Pelletier, J., "Pathophysiology of osteoarthritis," Osteoarthritis and Cartilage 12:S31-S33 (2004).

Mistretta, C.A. et al., "Highly constrained backprojection for time-resolved MRI," Magn Reson Med 55:30-40 (2006).

Mrosek, E.H. et al., "Subchondral bone trauma causes cartilage matrix degeneration: an immunohistochemical analysis in a canine model," Osteoarthritis and Cartilage 14:171-180 (2006).

Muir, P. et al., "Role of endochondral ossification of articular cartilage and functional adaptation of the subchondral plate in the development of fatigue microcracking of joints," Bone 38:342-349 (2006).

Pauly, J.M. et al., "Slice-Selective Excitation for Very Short $T_2$ Species," Proceedings of the Society Magnetic Resonance in Medicine, Amsterdam, The Netherlands, Aug. 12-18, 1989, p. 28.

Pauly, J.M. et al., "Suppression of long T2 components for short T2 imaging," Proceedings of the 10th annual meeting of SMRI, New York, USA, Abstract No. p. 330, p. 145 (1992).

Peters, D.C. et al., "Undersampled projection reconstruction applied to MR angiography," Magnetic Resonance in Medicine 43:91-101 (2000).

Rahmer et al., "Three dimensionalradial ultrashort echo-time imaging with T2 adapted sampling," Magn. Reson. Med. 2006; 55: 1075-1082.

Recht, M.P. et al., "MRI of articular cartilage: revisiting current status and future directions," AJR 185:899-914 (2005).

Reichert, I.L.H., "Magnetic resonance imaging of cortical bone with ultrashort TE pulse sequences," Magn Reson Imag 23:611-618 (2005).

Robson, M.D. et al., "Magnetic resonance imaging of the Achilles tendon using ultrashort TE (UTE) pulse sequences," Clinical Radiology 59:727-735 (2004).

Robson, M.D. et al., "Magnetic Resonance: An Introduction to Ultrashort TE (UTE) Imaging," J. Comput Assist Tomogr 27(6): 825-846 (2003).

Robson, M.D. et al., "Ultrashort TE chemical shift imaging (UTE-CSI)," Magnetic Resonance in Medicine 53:267-274 (2005).

Schroeder C, et al., "Scan Time Reduction for Ultrashort TE Imaging at 3Tm" Proc. Int. Soc. Mag.Reson. Med., vol. 11, p. 630 (2004).

Silver, M.S. et al., "Highly Selective $\pi/2$ and $\pi$ pulse generation," J. Magn. Reson. 1984; 59: 347-351.

Song, H.K. and L. Dougherty, "Dynamic MRI with projection reconstruction and KWIC processing for simultaneous high spatial and temporal resolution.," Magnetic Resonance in Medicine 52: 815-824 (2004).

Squires, G.R., "The pathobiology of focal lesion development in aging human articular cartilage and molecular matrix changes characteristic of osteoarthritis," Arthritis & Rheumatism 48:1261-1270 (May 2003).

Stanisz, G.J. et al., "$T_1$, $T_2$ Relaxation and Magnetization Transfer in Tissue at 3T," Magn. Reson. Med. 54: 507-512 (2005).

Sussman et al., "Designs of practical T2-selective RF excitation (TELEX) pulses," Magn. Reson. Med. 40:890-899 (1998).

Takahashi, A.M., et al., "Ultrashort TE (UTE) imaging at 8 μsec with 3D vastly undersampled isotropic projection reconstruction (VIPR)," Proceedings of the 13th Annual Meeting of Intl. Soc. Mag. Reson. Med, Miami, USA, vol. 13, p. 2405 (2005).

Techawiboonwong, A. et al., "In vivo MRI of submillisecond $T_2$ species with two dimensional and three-dimensional radial sequences and applications to the measurement of cortical bone water," NMR in Biomed 21:59-70 (2008).

Vidarsson, L. et al., "Echo time optimization for linear combination myelin imaging," Magn. Reson. Med. 53: 398-407 (2005).

Wanspaura, J.P. et al., "Temperature mapping of frozen tissue using eddy current compensated half excitation RF pulses," Magn Reson Med 2001; 46:985-992.

Wu et al., "Water- and fat-suppressed proton projection MR (WASPI) of rat femur one," Magn Reson Med 57: 554-567 (2001).

Alley, M.T., et al., "Gradient Characterization Using a Fourier-Transform Technique," Magnetic Resonance in Medicine, 39(4):581-587, Apr. 1998.

Amann, M., et al., "Three-Dimensional Spiral MR Imaging: Application to Renal Multiphase Contrast-Enhanced Angiography," Magnetic Resonance in Medicine, 48(2):290-296, Aug. 2002.

Barger, A.V., et al., "Time-Resolved Contrast-Enhanced Imaging With Isotropic Resolution and Broad Coverage Using an Undersampled 3D Projection Trajectory," Magnetic Resonance in Medicine, 48(2):297-305, Aug. 2002.

Borthakur, A., et al., "NMR Studies of Exchangeable Hydrogen in Bone," Proceedings of the 6th Annual Meeting of ISMRM, Sydney, Australia, pp. 1804, (1998).

Brown, T.R., et al., "NMR chemical shift imaging in three dimensions," Proceedings of the National Academy of Sciences of the USA, 79(11):3523-3526, Jun. 1982.

Cho, G., et al., "Detection of Hydroxyl Ions in Bone Mineral by Solid-State NMR Spectroscopy," Science, 300 (5622):1123-1127, May 2003.

De Graaf, A.A., et al., "Quality: Quantification Improvement by Converting Lineshapes to the Lorentzian Type," Magnetic Resonance in Medicine, 13(3):343-357, Mar. 1990.

Du, J., et al., "Spectroscopic Imaging of the Knee Using an Interleaved Ultrashort TE(UTE) Sequence," The International Society for Magnetic Resonance in Medicine, 15:1240, (2007).

Du, J., et al., "Time-resolved Three-dimensional Pulmonary MR Angiography Using a Spiral-TRICKS sequence," Proceedings of the International Society for Magnetic Resonance in Medicine, 14:3635, (2006).

Du, J., et al., "Time-Resolved Undersampled Projection Reconstruction Magnetic Resonance Imaging of the Peripheral Vessels Using Multi-Echo Acquisition," Magnetic Resonance in Medicine, 53(3):730-734, Mar. 2005.

Du, J. et al., "Ultrashort TE Spectroscopic Imaging (UTESI): Application to the Imaging of Short T2 Relaxation Tissues in the Musculoskeletal System," Journal of Magnetic Resonance Imaging, 74 pages.

Du, J., et al.,"Ultrashort TE Imaging of the Short T2 Components in White Matter Using Half Pulse Excitation and Spiral Sampling," Proceedings of the International Society for Magnetic Resonance in Medicine, 14:334, (2006).

Duyn, J.H., et al., "Simple Correction Method for k-Space Trajectory Deviations in MRI," Journal of Magnetic Resonance, 132(1):150-153, May 1998.

Fantazinni, P., et al., "NMR relaxation in trabecular and cortical bone," Calcified Tissue International, 71(3):275, Sep. 2002.

Glover, G.H., "Simple Analytic Spiral K-Space Algorithm," Magnetic Resonance in Medicine, 42(2):412-415, Aug. 1999.

Gold, G.E., et al., "Short Echo Time MR Spectroscopic Imaging of the Lung Parenchyma," Journal of Magnetic Resonance Imaging, 15(6):679-684, Jun. 2002.

Gurney, P., et al. "Long-T2 Suppressed Ultra Short-TE 3DPR Imaging," Proceedings of the International Society for Magnetic Resonance in Medicine, 13:787, (2005).

Henkelman, R.M., et al., "Magnetization transfer in MRI: a review," NMR in Biomedicine, 14(2):57-64, Apr. 2001.

Herlihy, A.H., et al., "MRI Visualization of Wood Samples with Ultra Short TE Sequences," Proceedings of the International Society for Magnetic Resonance in Medicine, 13:2355, (2005).

Jehenson, P., et al., "Analytical Method for the Compensation of Eddy-Current Effects Induced by Pulsed Magnetic Field Gradient in NMR Systems," Journal of Magnetic Resonance, 90(2):264-278, Nov. 1990.

Kaye, E., et al., "Consistency of Signal Intensity and R2* in Frozen Porcine Kidney and Liver," Proceedings of the International Society for Magnetic Resonance in Medicine, 14:1423, (2006).

King, K F., et al., "Optimized Gradient Waveforms for Spiral Scanning," Magnetic Resonance in Medicine, 34 (2):156-160, Aug. 1995.

Korosec, F.R., et al., "Time-Resolved Contract-Enhanced 3D MR Angiography," Magnetic Resonance in Medicine, 36(3):345-351, Sep. 1996.

Larkman, D.J., "Parallelised Sequences," European Society for Magnetic Resonance in Medicine and Biology (ESMRMB), Teaching Session I, 6 pages, Sep. 2005, http://www.esmrmb.org/html/img/pool/07_Larkman.pdf.

Larson, P.E., et al., "Using Adiabatic Inversion Pulses to Suppress Long-T2 Species in Ultra-short Echo Time (UTE) Imaging," Proceedings of the International Society for Magnetic Resonance in Medicine, 13:786, (2005).

Lee, J.H., et al., "Fast 3D Imaging Using Variable-Density Spiral Trajectories With Applications to Limb Perfusion," Magnetic Resonance in Medicine, 50(6):1276-1285, Dec. 2003.

Lu, A., et al., "Improved Slice Excitation for Ultra-short TE Imaging with B0 and Linear Eddy Current Correction," Proceedings of the International Society for Magnetic Resonance in Medicine, 14:2381, (2006).

Lustig, M., et al., "Fast Spiral Fourier Transform for Iterative MR Image Reconstruction," IEEE International Symposium on Biomedical Imaging: Nano to Macro, vol. 1, pp. 784-787, Apr. 2004.

Maudsley, A.A., et al., "Spatially Resolved High Resolution Spectroscopy by 'four-dimensional' NMR," Journal of Magnetic Resonance, 51:147-152, (1983).

Meyer, C.H., et al., "Fast Spiral Coronary Artery Imaging," Magnetic Resonance in Medicine, 28(2):202-213, Dec. 1992.

Mierisova, S., et al., "MR spectroscopy quantitation: a review of frequency domain methods," NMR in Biomedicine, 14(4):247-259, Jun. 2001.

Mistretta, C.A., et al., "3D Time-Resolved Contrast-Enhanced MR DSA: Advantages and Tradeoffs," Magnetic Resonance in Medicine, 40(4):571-581, Oct. 1998.

Noll, D.C., et al., "Deblurring for Non-2D Fourier Transform Magnetic Resonance Imaging," Magnetic Resonance in Medicine, 25(2):319-333, Jun. 1992.

Panting, J.R., et al., "Abnormal Subendocardial Perfusion in Cardiac Syndrome X Detected by Cardiovascular Magnetic Resonance Imaging," The New England Journal of Medicine, 346(25):1948-1953, Jun. 2002.

Reichert, I., et al., "Magnetic Resonance Imaging of Periosteum With Ultrashort TE Pulse Sequences," Journal of Magnetic Resonance Imaging, 19(1):99-107, Jan. 2004.

Sartoris, D.J., "Chapter 18: Quantitative Bone Mineral Analysis," Bone and Joint Imaging, 2nd Ed., D. Resnick, editor, W.B. Saunders Company, pp. 154-164, (1996).

Schroeder, C., et al., "Slice Excitation for Ultrashort TE Imaging," Proceedings of the International Society for Magnetic Resonance in Medicine, 11:628, (2004).

Song, H.K., et al., "Variable TE Gradient and Spin Echo Sequences for In Vivo MR Microscopy of Short T2 Species," Magnetic Resonance in Medicine, 39(2):251-258, Feb. 1998.

Stoyanova, R., et al., "Application of Principal-Component Analysis for NMR Spectral Quantitation," Journal of Magnetic Resonance, Series A, 115(2):265-269, Aug. 1995.

Techawiboonwong, A., et al., "Quantification of bone-water concentration in a 3T whole-body imager using solid-state imaging," Proceedings of the International Society for Magnetic Resonance in Medicine, 14:3620, (2006).

Vasnawala, S.S., et al., "MR imaging of knee cartilage with FEMR," Skeletal Radiology, 31(10):574-580, Oct. 2002.

Vigen, K.K., et al., "Undersampled Projection-Reconstruction Imaging for Time-Resolved Contrast-Enhanced Imaging," Magnetic Resonance in Medicine, 43(2):170-176, Feb. 2000.

Waldman, A., et al., "MRI of the brain with ultra-short echo-time pulse sequences," Neuroradiology, 45(12):887-892, Dec. 2003.

Wehrli, F.W. et al., "Nuclear Magnetic Resonance Studies of Bone Water," Annals of Biomedical Engineering, 33 (1):79-86, Jan. 2005.

Wehrli, F.W., et al., "Quantitative MRI for the assessment of bone structure and function," NMR in Biomedicine, 19 (7):731-764, Nov. 2006.

Ying, K., et al., "Echo-Time Reduction for Submillimeter Resolution Imaging with a 3D Phase Encode Time Reduced Acquisition Method," Magnetic Resonance in Medicine, 33(1):82-87, Jan. 1995.

Yudilevich, E., et al., "Spiral sampling: theory and an application to magnetic resonance imaging," Journal of the Optical Society of America A, 5(4):542-553, Apr. 1988.

Zhu, H., et al., "High Temporal and Spatial Resolution 4D MRA Using Spiral Data Sampling and Sliding Window Reconstruction," Magnetic Resonance in Medicine, 52(1):14-18, Jul. 2004.

* cited by examiner

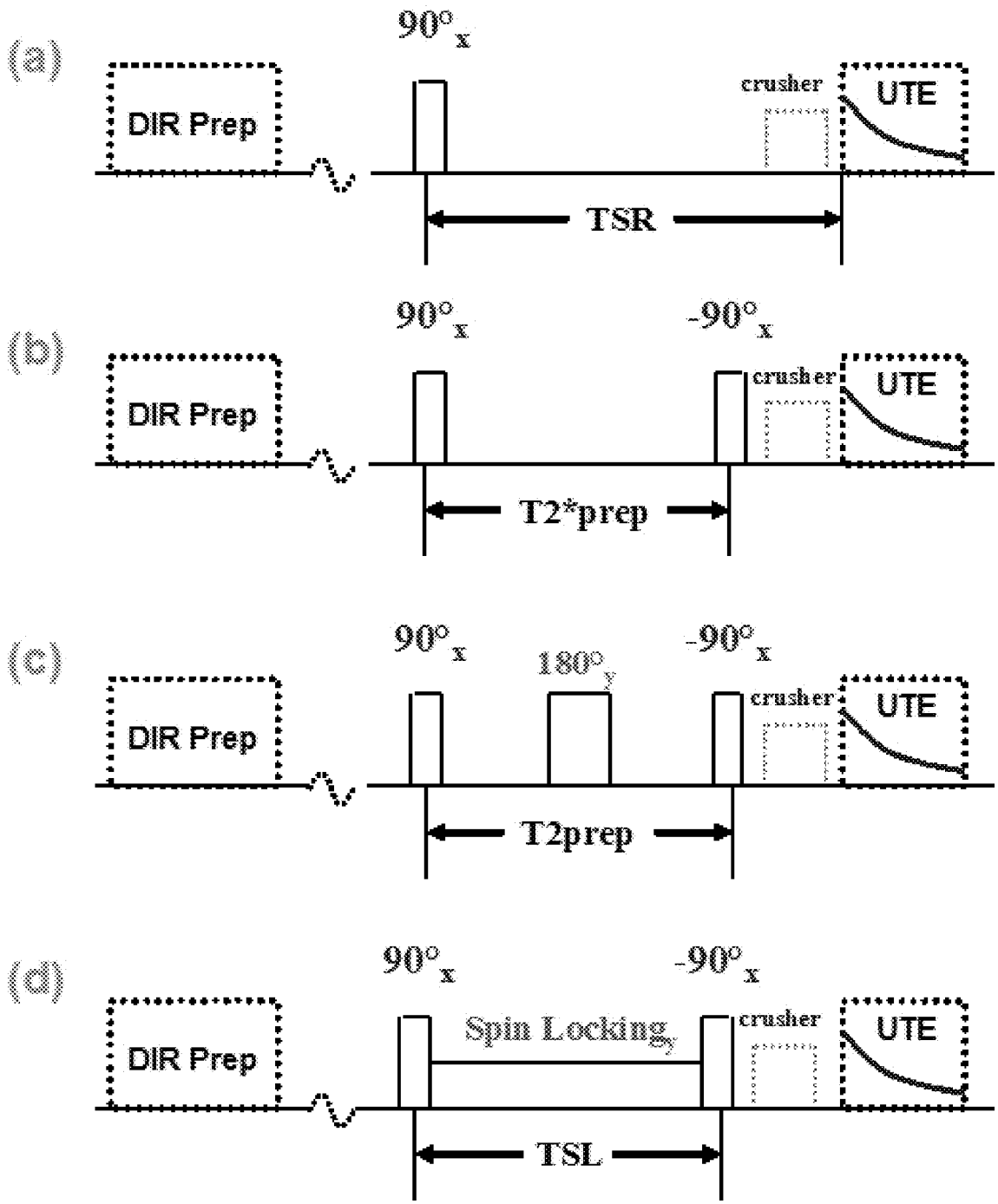
FIG. 10(a)-(d)

US 8,148,979 B1

SELECTIVE MAGNETIC RESONANCE IMAGING

CROSS REFERENCE TO RELATED APPLICATIONS

This specification claims priority under 35 U.S.C. §119(e) to U.S. Provisional Application Ser. No. 61/045,496, entitled "Magnetic Resonance Imaging Using Adiabatic Inversion" filed Apr. 16, 2008, the entire disclosure of which is incorporated herein by reference.

TECHNICAL FIELD

This specification relates to nuclear magnetic resonance imaging (MRI).

BACKGROUND

Imaging through magnetic resonance (MR) techniques can be used to acquire images in medical, biological and other fields. MR imaging (MRI) techniques produce an image of an object under examination by manipulating magnetic spins in the object and processing measured responses from the magnetic spins. An MRI system may include hardware to generate different magnetic fields for imaging, including a static magnetic field along a z-direction to polarize a portion of the magnetic spins, magnetic field gradients (e.g., along mutually orthogonal x, y, or z directions), and RF magnetic fields to manipulate the spins. The RF pulses, applied transverse to the primary axis defined by the external field, are used to manipulate the magnetization of the sample. Transverse components of the magnetization of the sample can induce time-varying currents in the RF coils, and the induced currents can be used to construct an image of the sample.

SUMMARY

Techniques and systems for selective magnetic resonance imaging are introduced. Imaging of tissues having short transverse relaxation times, T2, is described including short echo time (TE) signal acquisition preceded by suppression of signal from the surrounding tissues having long transverse relaxation times, T2, to increase the contrast and dynamic range of magnetic resonance (MR) images contributed by the tissues having short T2.

In one aspect, a method performed by a magnetic resonance imaging system is described. The method includes preparing a magnetization of species within a sample. The method also includes selectively modifying, for a select period of time, the prepared magnetization to suppress, at a given time, a component of the modified magnetization corresponding to two or more of the species having long transverse relaxation times, T2. Additionally, the method includes selectively modifying, for a select period of time, the prepared magnetization to identify, at the given time, a component of the modified magnetization corresponding to at least one of the species having a short transverse relaxation time, T2. Each short T2 is shorter than the select period of time, and the select period of time is shorter than each long T2. The method further includes exciting, at the given time, the identified component of the modified magnetization corresponding to the at least one short T2 species. In addition, the method includes detecting radio frequency (RF) emissions corresponding to relaxation of the excited magnetization corresponding to the at least one short T2 species.

Implementations of the method can optionally include one or more of the following features. The method may include converting the detected RF emissions into an image contributed by the excited magnetization corresponding to the at least one short T2 species. Further, selectively modifying, for the select period of time, the prepared magnetization to suppress, at the given time, the component of the modified magnetization corresponding to the two or more long T2 species, may include, for each of the two or more long T2 species, selectively inverting a corresponding magnetization component by applying, at a respective inversion initiation time, a respective adiabatic inversion pulse centered at a respective resonant frequency. A respective duration of the respective adiabatic inversion pulse may be selected to be shorter than or equal to the select period of time. Additionally, the inverted corresponding magnetization component may reach zero value after a respective inversion time interval measured from the respective inversion initiation time. Also, the inversion initiation times can be selected such that the inversion time intervals end at the given time to suppress the component of the modified magnetization corresponding to the two or more long T2 species. Furthermore, selectively modifying, for the select period of time, the prepared magnetization to identify, at the given time, the component of the modified magnetization corresponding to the at least one short T2 species, may include selectively maintaining an orientation of a component of the prepared magnetization corresponding to the at least one short T2 species by applying the adiabatic inversion pulses. The durations of the adiabatic inversion pulses may be selected to be longer than each short T2. Further yet, exciting the identified component of the modified magnetization may also include selecting a portion of the sample and exciting the identified component of the modified magnetization of the selected portion of the sample. Also, preparing the magnetization of the species within the sample may include orienting nuclear spins of the species in a uniform magnetic field.

In another aspect, a magnetic resonance imaging (MRI) system is described. The MRI system includes a scanner. The scanner contains a magnet, gradient coils and a radio frequency (RF) transceiver. The scanner prepares a magnetization of species within a sample. In addition, the scanner selectively modifies, for a select period of time, the prepared magnetization to suppress, at a given time, a component of the modified magnetization corresponding to two or more of the species having long transverse relaxation times, T2. The scanner also selectively modifies, for a select period of time, the prepared magnetization and to identify, at the given time, a component of the modified magnetization corresponding to at least one species having a short transverse relaxation time, T2. Each short T2 is shorter than the select period of time, and the select period of time is shorter than each long T2. The scanner excites, at the given time, the identified component of the modified magnetization corresponding to the at least one short T2 species. Additionally, the scanner detects RF emissions corresponding to relaxation of the excited magnetization corresponding to the at least one short T2 species. The MRI system also includes a data processor in communication with the scanner. The data processor receives the detected RF emissions from the scanner. Further, the data processor converts the received RF emissions into an image contributed by the excited magnetization corresponding to the at least one short T2 species.

Implementations of the scanner can optionally include one or more of the following features. For each of the two or more long T2 species, the scanner can selectively invert a corresponding magnetization component by applying, at a respective inversion initiation time, a respective adiabatic inversion pulse centered at a respective resonant frequency. A respective duration of the respective adiabatic inversion pulse may be selected to be shorter than or equal to the select period of time. The inverted corresponding magnetization component can reach zero value after a respective inversion time interval measured from the respective inversion initiation time. The inversion initiation times may be selected such that the inversion time intervals end at the given time to suppress the component of the modified magnetization corresponding to the two or more long T2 species. The scanner can selectively maintain an orientation of a component of the prepared magnetization corresponding to the at least one short T2 species by applying the adiabatic inversion pulses. The durations of the adiabatic inversion pulses may be selected to be longer than each short T2.

In some implementations, the two or more species having long T2 may include water and fat. The adiabatic inversion pulse to selectively invert the component of the modified magnetization corresponding to water may be centered at 0 Hz. Further, the adiabatic inversion pulse to selectively invert the component of the modified magnetization corresponding to fat may be centered at −440 Hz. The adiabatic inversion pulses can have a duration of 17-25 ms and a spectral bandwidth of 200-500 Hz. Also, the adiabatic inversion pulse to selectively invert the component of the modified magnetization corresponding to water can be spectrally shifted from at 0 Hz to 100 Hz. The adiabatic inversion pulse to selectively invert the component of the modified magnetization corresponding to fat can be spectrally shifted from −440 Hz to −500 Hz or to −600 Hz.

In some implementations, the scanner can select a portion of the sample, and may excite the identified component of the modified magnetization of the selected portion of the sample. The scanner can excite the identified component of the modified magnetization of the selected portion of the sample by performing one or more of the following optional operations. The scanner may select the portion of the sample by applying a bipolar slice selective gradient. The scanner may also apply an RF half-pulse to excite the identified component of the modified magnetization of the selected portion of the sample. The RF half-pulse may be synchronized on a second half of the applied bipolar slice selective gradient. The scanner can detect RF emissions by performing one or more of the following optional operations. The scanner may acquire a free-induction decay (FID) signal after a time echo (TE) from the application of the RF half-pulse. The acquired FID signal may correspond to relaxation of the excited identified component of the magnetization of the selected portion of the sample. Also, the TE may be 8 μs or more. The scanner may also apply bipolar readout gradients configured for FID signal acquisition along radial projections of k-space.

In other implementations, the data processor can convert the detected RF emissions into an image contributed by the excited magnetization within the selected portion of the sample by performing one or more of the following optional operations. The data processor may sum FID signals acquired along radial projections of k-space to obtain projection data of the selected portion of the sample. The data processor may also regrid the projection data of the selected portion of the sample onto Cartesian grids. Additionally, the data processor may obtain an MR image of the selected portion of the sample by applying a Fourier transformation to the regridded projection data of the selected portion of the sample. In yet other implementations, the magnet can orient nuclear spins of the species in a uniform magnetic field to prepare the magnetization of the species within the sample.

In some implementations, the scanner can saturate the identified component of the modified magnetization corresponding to the at least one short T2 species, by applying a hard 90° x pulse shorter than the short T2. The scanner can also detect, after each of a series of saturation recovery time periods, a corresponding signal proportional to a longitudinal relaxation of the saturated magnetization. The data processor may identify a longitudinal relaxation time, T1, corresponding to the short T2 species, based on the detected signals.

In other implementations, the scanner can alter the identified component of the modified magnetization, corresponding to the at least one short T2 species, by performing one or more of the following optional operations. The scanner may apply a hard 90° x pulse shorter than the short T2 to tip the identified component of the modified magnetization into a transverse plane. After each of a series of T2*-preparation time periods, the scanner may apply a hard −90° x pulse shorter than the short T2 to restore the tipped magnetization to a longitudinal axis. For each of the series of T2*-preparation time periods, the scanner may detect a signal proportional to a T2*-relaxation of the altered magnetization. The data processor may identify a relaxation time, T2*, corresponding to the short T2 species, based on the detected signals.

In further implementations, the scanner can alter the identified component of the modified magnetization, corresponding to the at least one short T2 species, by performing one or more of the following optional operations. The scanner may apply a hard 90° x pulse shorter than the short T2 to tip the identified component of the modified magnetization into a transverse plane. The scanner may apply a hard 180° x pulse shorter than the short T2 to refocus the tipped magnetization. After each of a series of T2-preparation time periods, the scanner may apply a hard −90° x pulse shorter than the short T2 to restore the tipped magnetization to a longitudinal axis. For each of the series of T2-preparation time periods, the scanner may detect a signal proportional to a transverse relaxation of the altered magnetization. The data processor may identify a transverse relaxation time, T2, based on the detected signals.

In yet other implementations, the scanner can alter the identified component of the modified magnetization, corresponding to the at least one short T2 species, by performing one or more of the following optional operations. The scanner may apply a hard 90° x pulse shorter than the short T2 to tip the identified component of the modified magnetization into a transverse plane. For each of a series of spin-locking time periods, the scanner may apply a hard pulse to spin-lock the tipped magnetization. The scanner may then apply a hard −90° x pulse shorter than the short T2 to restore the spin-locked magnetization to a longitudinal axis. For each of the series of spin-locking time periods, the scanner may detect a signal proportional to a transverse relaxation of the altered magnetization. The data processor may identify a relaxation time, T1ρ, based on the detected signals.

In another aspect, a method for nuclear magnetic resonance imaging (MRI), is described. The method includes applying to a sample a first radio frequency (RF) pulse at a first resonance frequency to adiabatically invert nuclear spins having the first resonance frequency and a first transverse relaxation rate. The method further includes applying to the sample a second RF pulse at a second resonance frequency to adiabatically invert nuclear spins having the second resonance frequency and a second transverse relaxation rate. Additionally, the method includes generating an image of at least part of the sample based on a magnetic resonance signal produced by a plurality of nuclear spins having one or more transverse relaxation rates that are faster than the first and second transverse relaxation rates.

Implementations of the method can optionally include acquiring the magnetic resonance signal with an ultrashort echo time (UTE) acquisition. The method may also optionally include acquiring the magnetic resonance signal after a point in time when the nuclear spins having the first resonance frequency and the nuclear spins having the second resonance frequency have simultaneously reached zero longitudinal magnetization states from inverted spin states due to longitudinal relaxation.

The dual adiabatic inversion recovery ultrashort echo time (DIR UTE) imaging techniques, apparatus and systems described in this specification can optionally provide one or more of the following advantages. The human body contains a variety of tissues with short transverse relaxation times, T2, components such as the deep radial and calcified layers of articular cartilage, menisci, ligaments, tendon, cortical and trabecular bone, periosteum, myelin, calcifications, as well as the short T2 components in brain white matter. The T2 for these tissues may range from several milliseconds down to hundreds of microseconds. Signal from these tissues can decay to zero quickly after excitation. The DIR UTE technique described in this specification, which includes echo times of order 8 µs or more, can detect signals corresponding to the range of short T2 tissues enumerated above.

In addition, the described imaging techniques, apparatus and systems can optionally provide one or more of the following features. Short T2 tissues can be imaged, including cortical and trabecular bone, calcified cartilage, meniscus, tendon, ligaments, enthesis, etc in the musculoskeletal system. Also, the short T2 components can be imaged in brain white matter. Calcification can be imaged in various human organs, such as calcification in carotid plaque. Tissue properties can be quantified, such as T2 and T1 relaxation times, where long T2 signals can be well suppressed, reducing long T2 contamination in short T2 and T1 quantification. Further, the DIR UTE technique can be used to reduce or suppress a signal from multiple distinct long T2 resonances at substantially the same time, while preserving a signal from short T2 resonances.

The techniques, apparatus and systems described in this specification may provide suppression of long T2 tissues and can increase the contrast and dynamic range of short T2 MR images. Additionally, the adiabatic suppression of signals from long T2 tissues described in this specification can be unaffected by inhomogeneities of the RF excitation (B1), thus DIR UTE can achieve increased contrast of short T2 MR images. Furthermore, the DIR UTE technique may produce high contrast images of the short T2 tissues even if the applied magnetic field B0 may present inhomogeneities or in the presence of eddy currents. Another potential advantage of the DIR UTE technique is that no empirical constants or scaling factors are used to obtain high contrast and high dynamic range MR images of short T2 tissues.

BRIEF DESCRIPTION OF DRAWINGS

These and other aspects will now be described in detail with reference to the following drawings.

FIG. 8 also shows axial imaging of the same patella acquired using a 3-dimensional radial ramp sampling with 8(N) UTE, 8(O) fat saturated UTE, and 8(P) DIR UTE pulse sequences.

Like reference symbols in the various drawings indicate like elements.

DETAILED DESCRIPTION

This specification describes imaging of tissues having short transverse relaxation times, T2, including short echo time (TE) signal acquisition preceded by suppression of signal from the surrounding tissues having long transverse relaxation times T2, to increase the contrast and dynamic range of magnetic resonance (MR) images contributed by the tissues having short T2. Techniques, apparatus and systems are described for suppression of signals from species having long T2 using two long adiabatic inversion pulses. One of the two long adiabatic inversion pulses inverts the longitudinal magnetization of long T2 water protons, for example. The other long adiabatic inversion pulse inverts the longitudinal magnetization of long T2 fat protons, for example.

Tissues having short T2 experience a significant transverse relaxation during the long adiabatic inversion process, and therefore remain largely unaffected by either inversion pulse. Ultrashort TE (UTE) acquisition with a short TE of 8 microseconds (µs) starts following a time delay of TI1 for the inverted water protons to reach a null point, and a time delay of TI2 for the inverted fat protons to reach a null point. Suppression of the signal from tissues having long T2 depends on proper combination of TI1, TI2 and the repetition rate (TR), and may be insensitive to radio frequency (RF) inhomogeneities due to the adiabatic inversion pulses. Ultra-high image contrast (in comparison to other MRI techniques) can be achieved for tissues having short T2 as a result of simultaneous nulling of long T2 water and fat signals.

In one aspect, dual adiabatic inversion recovery ultrashort echo time (DIR UTE) imaging combines suppression of long T2 tissues with a UTE sequence with a short TE of 8 µs. Two adiabatic inversion pulses can be applied sequentially, with the first adiabatic inversion pulse focused on the water peak and the second adiabatic inversion pulse focused on the fat peak. UTE acquisition starts at a delay time of TI1 for the inverted water protons to reach a null point, and a delay time of TI2 for the inverted fat protons to reach a null point. The simultaneous nulling of long T2 water and fat signals provides ultrahigh image contrast for the short T2 tissues. This DIR UTE technique can be validated on cadaveric tissue samples and healthy volunteers on an imaging system, such as a clinical 3 T scanner.

Imaging of articular cartilage is used in diagnosis and grading of Osteoarthritis (OA). Articular cartilage contains about 68-85% water, 10-20% type I collagen, and 5-10% proteoglycans. For example, diagnosis based on magnetic resonance imaging (MRI) can produce results that may correlate well with arthroscopic examination. While the former imaging technique is non-invasive, the later examination technique is invasive.

Figure 1:
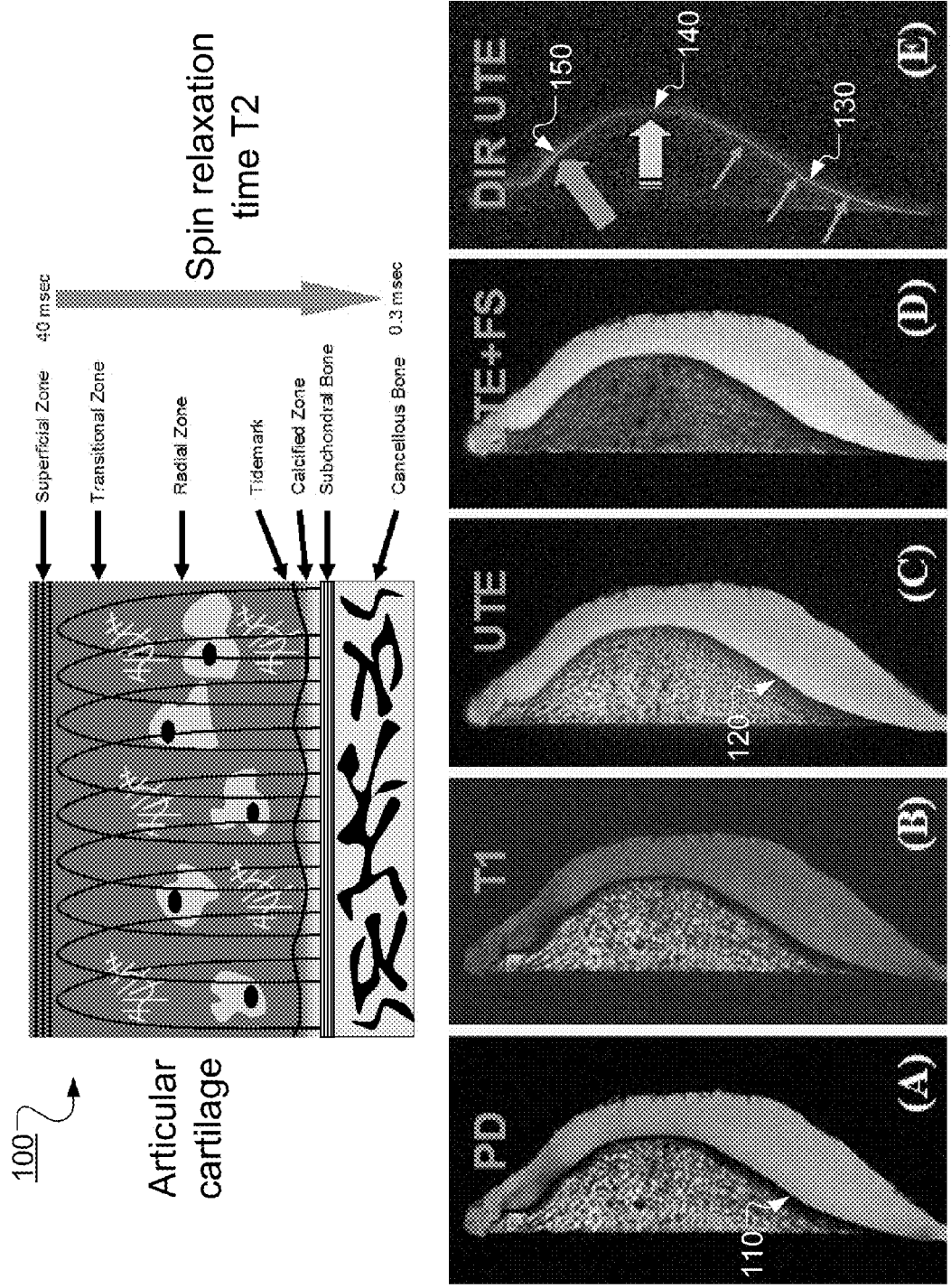
FIG. 1 illustrates schematically a layered structure of an articular cartilage. The insets 1(A)-1(E) of FIG. 1 show axial imaging of a patellar slice using 1(A) proton-density weighted fast spin echo (PD-FSE), 1(B) T1-weighted fast spin echo (T1-FSE), UTE 1(C) without and 1(D) with fat saturation (FS), and 1(E) DIR UTE sequences, respectively.

FIG. 1 illustrates schematically a layered structure 100 of an articular cartilage, including four zones, called the superficial zone, the transitional zone, the radial zone and the zone of calcified cartilage (ZCC). Additionally, there is change of collagen fiber orientation through the depth of articular cartilage. The orientation of collagen fibers changes from parallel to the articular surface to perpendicular to the articular surface at the bone interface. The forgoing factors determine a change in the relaxation time, T2, across the zones of articular cartilage, ranging from 40 ms for the superficial zone down to around 1 ms for ZCC, and even as short as 0.3 ms for the subchondral bone.

In the context of MRI, the relaxation time, T2, (also known as transverse relaxation time, or spin-spin relaxation time) presents a measure of the time it takes for spins precessing in a plane transverse to a uniform magnetic field to dephase (loose coherency, or rotate independently from each other). The relaxation time, T2, is a physical parameter specific to a material (i.e., T2 is a material property) and can depend, among other things, on the local structure of the material. For example, the ZCC is an order of magnitude less stiff than bone, but 10-100 fold stiffer than cartilage, thus the ZCC forms a transition zone of intermediate stiffness between the articular cartilage and the subchondral bone. The softer superficial zone has a longer relaxation time, T2, of order 40 ms, while the stiffer ZCC has a shorter relaxation time, T2, of order 1 MS.

Early and late alterations to ZCC may therefore be used to identify the structural and functional pathogenesis of OA including features associated with the stages of the disease. Additionally, the MR properties of the ZCC, e.g., (i) the relaxation time, T2, (which reflect molecular level changes in collagen), and (ii) T1ρ (which has been shown to correlate with proteoglycan depletion (an early sign of OA)) are virtually unknown. Therefore, a non-invasive examination technique, such as MRI, (1) to image the ZCC and (2) to quantify the MR properties of ZCC may be helpful in studying the pathogenesis of OA and recognizing early disease.

The insets 1(A)-1(E) of FIG. 1 show axial images of a patella slice obtained by MRI. The MR image of Inset 1(A), acquired using proton-density weighted fast spin echo (PD-FSE), illustrates a dark layer 110 where the ZCC (having a short relaxation time, T2) is expected. The MR image acquired using PD-FSE illustrates the bone marrow fat (to the left of the ZCC void in this MR image) and the superficial zone of articular cartilage (to the right of the ZCC void in this MR image), both visible zones having long relaxation time, T2. However, as seen in inset 1(A), the short relaxation time, T2, of the ZCC renders the ZCC invisible to PD-FSE MRI. As shown in the MR image of inset 1(B), the ZCC (having a short relaxation time, T2) is also invisible when imaged using T1-weighted fast spin echo (T1-FSE). The MR image of inset 1(C), acquired using ultrashort echo time (UTE), can illustrate the ZCC 120, even though the ZCC has a short relaxation time, T2. However, contrast is limited between the ZCC and bone marrow fat (to the left of ZCC in this MR image), and between the ZCC and the superficial zone of articular cartilage (to the right of ZCC in this MR image), where both neighboring regions having long relaxation time, T2. The MR image of inset 1(D), acquired using UTE with fat saturation (FS) also illustrates the ZCC (having a short relaxation time, T2). However contrast is again limited relative to the superficial zone of articular cartilage (to the right of ZCC in this MR image) and having long relaxation time, T2.

The MR image of inset 1(E) was acquired using techniques and systems described in this specification. A dual adiabatic inversion recovery Ultrashort TE (DIR UTE) sequence can selectively suppress signals from the superficial layers of articular cartilage and bone marrow fat, and may create increased image contrast with the ZCC. The healthy ZCC regions of the patella, imaged in inset 1(E), are represented by a linear, well-defined area of bright signal adjacent to the low signal intensity subchondral bone 130. Effacement 140 and thickening 150 of the linear MR signature of the ZCC on the medial facet suggests a deep layer lesion. Other examples of MR images taken using DIR UTE are presented in FIGS. 7, 8 and 11-13.

Figure 2:
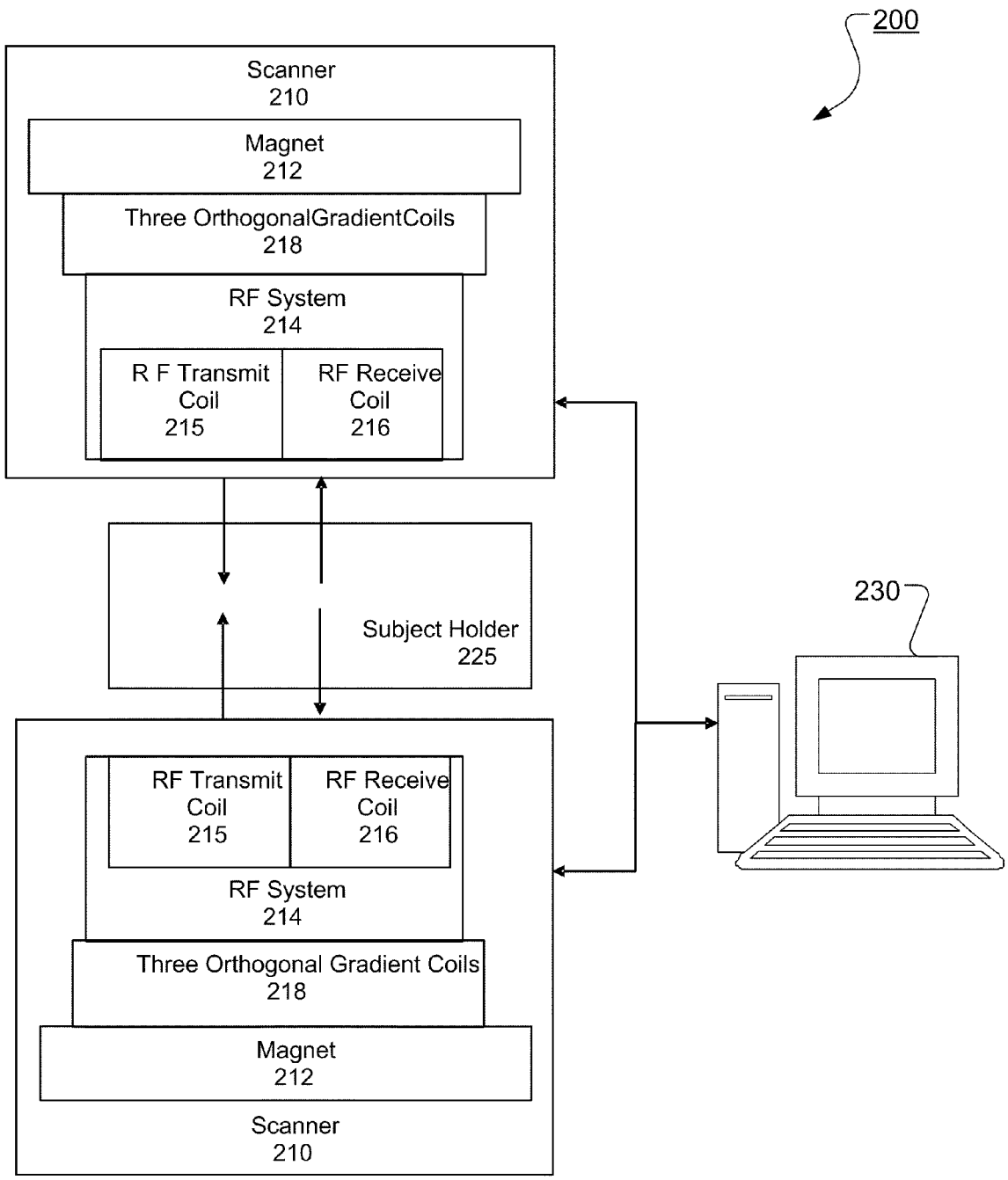
FIG. 2 illustrates an exemplary MRI system for implementing the techniques described in this specification.

FIG. 2 illustrates an example magnetic resonance imaging (MRI) system 200 for implementing the techniques described in this specification. Techniques as disclosed in this specification can be implemented using the MRI system 200. The MRI system 200 can be implemented using any one of various MRI scanners such as a Sigma Excite HD 3 T scanner with a single-channel head coil (available from GE Healthcare Technologies, Milwaukee, Wis.) The MRI system 200 includes a scanner 210, a data processing apparatus 230 and a subject holder or table 225 for holding a subject (not shown). The scanner 210 includes a main magnet 212, three orthogonal gradient coils 218 and a RF system 214. The main magnet 212 is designed to provide a constant, homogeneous magnetic field. The three orthogonal gradient coils 218 are designed to provide three orthogonal, controller magnetic gradients used to acquire image data of a desired slice by generating an encoded and slice-selective magnetic field. The RF system 214 includes a RF transmit coil 215 and a RF receive coil designed to transmit and receive RF pulses. The RF system 245 can further include a RF synthesizer (not shown) and a power amplifier (not shown). In some implementations, an integrated transceiver coil (not shown) can be implemented instead of the separate transmit coil 215 and receive coil 216 for transmitting and receiving RF signals. For example, a close-fitting smaller coil can improve image quality when a small region is being imaged. Further, various types of coils that are placed around specific parts of a body (e.g., the head, knee, wrist, etc.) or even internally can be implemented depending on the sample and imaging applications.

The static field generator 212 generates a strong static magnetic field Bo, which is used to line up nuclear spins in a target object (whose MRI image is being generated by the apparatus 200) along Bo. The gradient field generator 218, including the three orthogonal gradient coils, generates a gradient field G(r), which is superimposed on the static field Bo, so that nuclei in a selected plane can be excited by a proper choice of the frequency spectrum of the transverse RF excitation field. The RF excitation field generator 214 generates an RF excitation field B1+. When B1+ is applied to the object, typically as an RF excitation pulse transverse to Bo, the nuclei become excited (due to the RF energy imparted by the RF excitation pulse), so that the nuclear spins rotate by a flip angle. Subsequently, the excited nuclei gradually return to alignment with the static field Bo, giving up the excitation energy in the form of weak but detectable free induction decay (FID) signals, which are processed by the controller 230 to produce images of the target object.

The controller 230 controls the operation of the MRI apparatus 200, including but not limited to the generation of the gradient fields G(r), and B1+, as well as the processing of the FID signals resulting from the de-excitation (precession and relaxation) of the nuclei in the object. In particular, the controller 230, in conjunction with the three orthogonal gradient coils 218 and by the RF transmit coil 215, is configured to design and generate RF excitation pulses of various shapes that can be delivered in predetermined sequences. In some implementations, the RF excitation pulses are generated as a sequence referred to as the DIR UTE.

Figure 3:
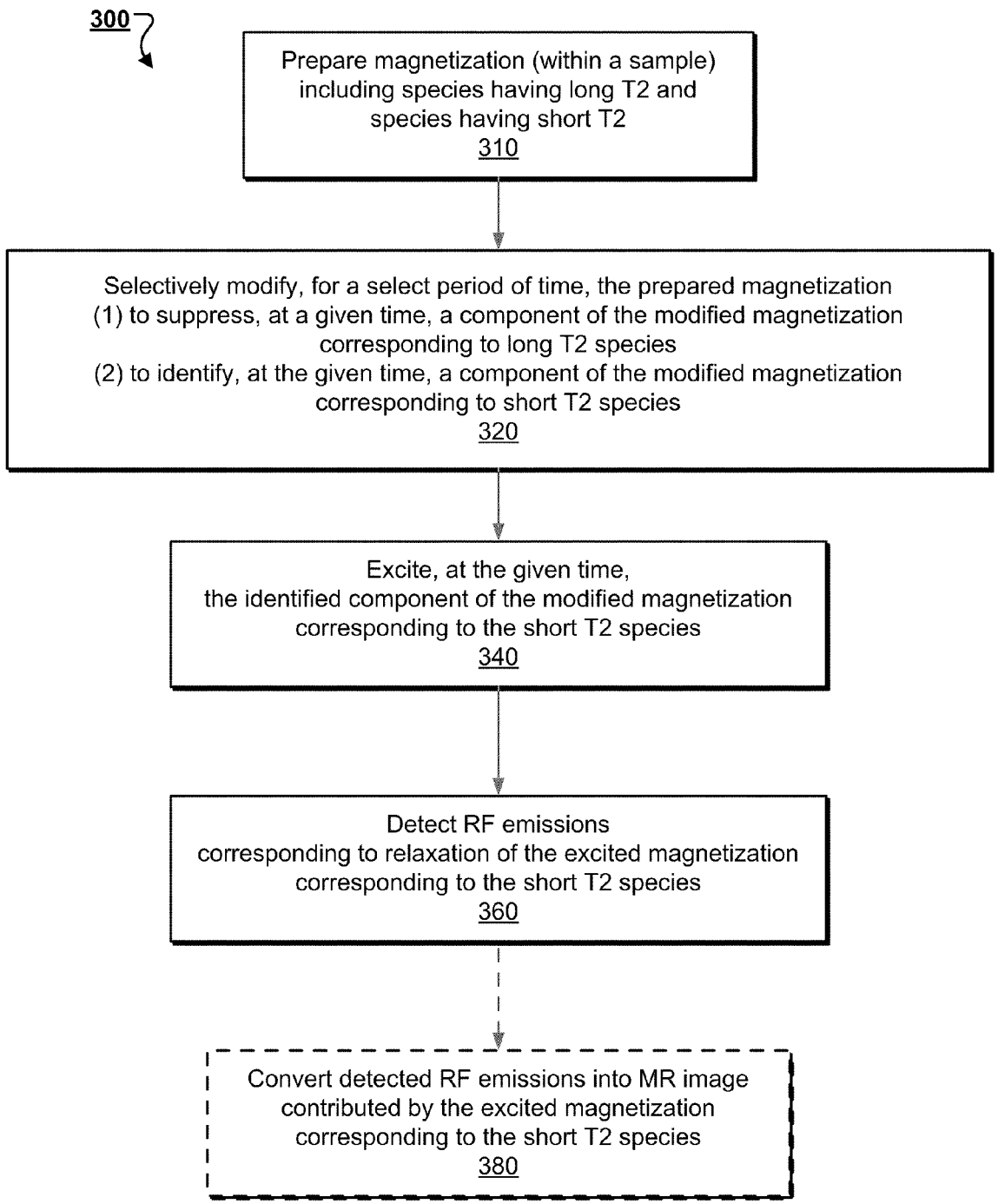
FIG. 3 illustrates an exemplary method for performing MRI based on DIR UTE.

FIG. 3 shows a method for obtaining images of a sample using magnetic resonance imaging. Method 300 is based on a dual adiabatic inversion preparation sequence.

A magnetization including nuclear spins of multiple species can be prepared within a sample (310). The sample can be a tissue, for example the articular cartilage having a layered structure as illustrated in FIG. 1. The magnetization can be prepared by aligning the nuclear spins of the multiple species in an externally applied, uniform magnetic field, B0. The magnetization resulting from the nuclear spins aligning to the applied magnetic field may be referred to as the longitudinal magnetization. The nuclear spins corresponding to the layers of the articular cartilage can have transverse relaxation times, T2, that vary from 40 ms (considered long T2) for the superficial zone of the cartilage, to 0.8 ms (considered short T2) for the ZCC. Moreover, water contained in the muscle tissue surrounding the cartilage, or fat in the marrow of bone in the vicinity of the cartilage may contain nuclear spins having long transverse relaxation times, T2.

Returning to FIG. 3, the prepared magnetization can be selectively modified, for a select period of time, to suppress, at a given time, a component of the modified magnetization corresponding to two or more of the species having long transverse relaxation times, T2 (320). Further, the prepared magnetization can be selectively modified, for the select period of time, to identify, at the given time, a component of the modified magnetization corresponding to at least one of the species having a short transverse relaxation time, T2. Each short T2 is shorter than the select period of time, and the select period of time is shorter than each long T2.

For each of the two or more long T2 species, the modification may involve respective adiabatic inversions at respective inversion initiation times, of the corresponding magnetization component. The selective aspect of the modification may refer to applying, for each of the two or more long T2 species, a respective adiabatic inversion pulse centered at a resonant frequency corresponding to each species having long transverse relaxation times, T2. An inverted magnetization associated with each of the two or more long T2 species reaches zero value after a respective inversion time interval, TI. The respective inversion time interval TI is measured from the respective inversion initiation time. The inversion initiation times may be selected such that each of the inversion time intervals, TI, end at the given time to suppress the modified magnetization corresponding to the two or more long T2 species. For example, two adiabatic inversion pulses can be applied sequentially, with the first adiabatic inversion pulse centered on the water peak and the second adiabatic inversion pulse centered on the fat peak. The nuclear spins of water and fat can have long transverse relaxation times, T2. Furthermore, the time interval between the first and second adiabatic inversion pulses may be selected as a difference between the first and second inversion time intervals for the nuclear spins of water and the nuclear spins of fat, respectively, such that the magnetizations including the nuclear spins of water and the nuclear spins of fat, respectively, reach the zero value simultaneously, at the given time.

Moreover, the component of the prepared magnetization including nuclear spins of the species having short transverse relaxation times, T2, may not change during the modification described above. For example, the orientation of the component of the prepared magnetization corresponding to the at least one short T2 species may be maintained substantially along the uniform applied magnetic field B0. In one implementation, when a sequence of adiabatic inversion pulses is being used to null the magnetization including the nuclear spins of species having long transverse relaxation times, T2, the magnetization including the nuclear spins of species having short transverse relaxation times, T2, may experience significant transverse relaxation during the inversion process. Thus, at the given time, when the portion of the magnetization that includes nuclear spins of the species having long transverse relaxation times, T2, has a value of zero, the modified magnetization may include substantially the nuclear spins of a species having a short transverse relaxation time, T2. Implementations of the modification are described further with reference to FIGS. 4-5 below.

Returning to FIG. 3, each short transverse relaxation time is shorter than a select period of time for selectively modifying the prepared magnetization. In turn, the select period of time is shorter than each long transverse relaxation time. In another representation, a time scale corresponding to the selective modification 320 is longer than the short transverse relaxation time, T2. However, the time scale corresponding to the selective modification 320 is shorter than each long transverse relaxation time, T2. For example, a transverse relaxation time, T2, of a species is considered long if an adiabatic inversion pulse can invert the nuclear spins of the species. For example, the nuclear spins of the species having a long T2 are aligned parallel with an externally applied magnetic field, B0, before the application of the adiabatic inversion pulse. After the application of the adiabatic inversion pulse, the nuclear spins of the species having a long T2 are aligned antiparallel with the externally applied magnetic field, B0. A duration of an adiabatic inversion pulse is shorter, by one order of magnitude or more for example, than a transverse relaxation time, T2 that is considered long. Accordingly, in the foregoing example, the time scale characteristic to the adiabatic inversion represents the duration of the adiabatic inversion pulse.

Furthermore, a transverse relaxation time, T2, of a species can be considered short if an adiabatic inversion pulse cannot invert the nuclear spins of the species. For example, the nuclear spins of the species having a short T2 are aligned parallel with the externally applied magnetic field, B0, before the application of the adiabatic inversion pulse. After the application of the adiabatic inversion pulse, the nuclear spins of the species having a short T2 continue to be aligned parallel with the externally applied magnetic field, B0. A duration of an adiabatic inversion pulse is longer, by one order of magnitude or more for example, than a transverse relaxation time, T2 that is considered short.

The modified magnetization including the nuclear spins of a species having a short transverse relaxation time, T2, may be probed by exciting, at the given time, the nuclear spins of the species having the short transverse relaxation time, T2 (340). By applying the excitation at the given time, when the portion of the magnetization including nuclear spins of the species having long transverse relaxation times, T2, may have a value of zero, only the nuclear spins of the species having short transverse relaxation times, T2, can be probed. RF excitation pulses that are shorter, by one order of magnitude or more for example, than the already short relaxation time, T2, may be used to excite the modified magnetization including the nuclear spins of the species having the short transverse relaxation time, T2.

RF emissions corresponding to relaxation of the excited nuclear spins of the species having the short transverse relaxation time, T2, may be detected (360). A portion of the sample may be selected to excite, at the given time, the modified magnetization, and then to detect emissions from the excited magnetization corresponding to the selected portion of the sample. Implementations of exciting the modified magnetization, detecting emissions from the excited magnetization, and selecting a portion of the sample are described further with reference to FIG. 6 below.

Returning to FIG. 3, the detected RF emissions can be optionally converted into an image of the selected portion of the sample (380). The image constructed in this manner may be contributed by the nuclear spins of the species having the short transverse relaxation time, T2.

Figure 4:
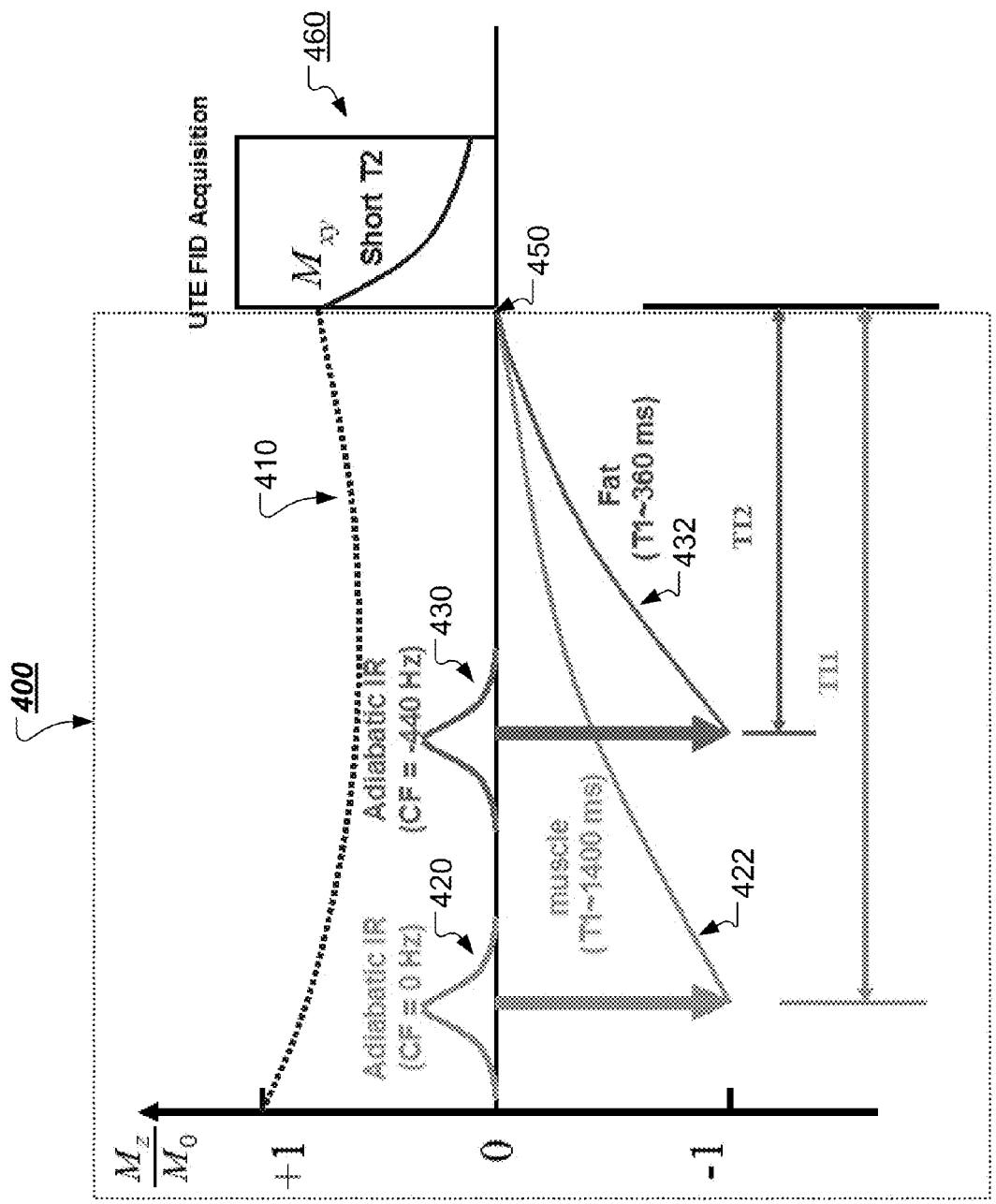
FIG. 4 shows a preparation sequence for a DIR UTE technique.

FIG. 4 illustrates preparation aspects of a DIR UTE acquisition scheme. In some implementations, the DIR UTE approach may employ a sequence 400 of two long adiabatic IR pulses (17 to 25 ms in duration) with narrow bandwidths to selectively invert the long T2 water and fat magnetization, respectively. The adiabatic IR pulse 420 can be centered at 0 Hz to invert long-T2 water magnetization. The adiabatic IR pulse 420 may have a spectral bandwidth of about 200 Hz, and the center frequency may vary between 0 to 100 Hz. Another adiabatic IR pulse 430 can be centered at −440 Hz to invert fat magnetization. The other adiabatic IR pulse 430 may also have a spectral bandwidth of about 200 Hz and the center frequency may vary between −440 to −540 Hz. The two inversion pulses can be separated by more than 440 Hz, thus minimizing the spectral overlapping that may results in partial inversion.

The adiabatic IR pulse 420 may be spectrally centered on the water peak and applied first because the nuclear spins of water protons have longer longitudinal relaxation times T1 (−1300 ms for muscle at when an external uniform magnetic field of 3 T is applied to the sample). Thus, the inverted nuclear spins of the water protons may take a longer time delay, called an inversion time interval, TI1, 422 to reach the null point 450. At the null point 450, the value of a portion of the sample magnetization contributed by the water protons is zero. The other adiabatic IR pulse 430 may be spectrally centered on the fat peak because the nuclear spins of fat protons have a shorter T1 (−360 ms for fat at 3 T). Thus, the inverted nuclear spins of the fat protons may take a time delay, called another inversion time interval, TI2, 432 shorter than TI1, to reach the null point 450. At the null point 450, the value of a portion of the sample magnetization contributed by the fat protons is zero. Fat has shorter T1 and requires a time delay, TI2, shorter than TI1 to reach the null point 450. Notably, the inversion time intervals, TI1, 422 and, TI2, 432 may depend on both tissue properties (such as the longitudinal relaxation time T1) and repetition rate, TR. Combinations of TI1, TI2, and TR may be chosen to null, at the same time 450, the nuclear spins corresponding to water and nuclear spins corresponding to fat.

Note that the preparation pulse sequence 400 applied to the sample can null, at the same time 450, the portions of longitudinal magnetization corresponding to the nuclear spins of water and fat, respectively. Also note that the longitudinal magnetization for short-T2 species 410 is not inverted by the sequence of adiabatic IR pulses 400 because the magnetization contributed by the nuclear spins of the species characterized by short transverse relaxation time, T2, experience significant transverse relaxation during the long adiabatic inversion process. The UTE acquisition 460 (described further with reference to FIG. 6) can start at a time 450, i.e., after a time delay of TI1 422 relative to the first adiabatic IR pulse and after a time delay TI2 432 relative to the second adiabatic IR pulse, when the long-T2 water and fat signals may be simultaneously suppressed. Hence, the simultaneous nulling of the magnetization contributed by water and fat, characterized by long transverse relaxation time, T2, may lead to high image contrast for MR imaging contributed by the nuclear spins of the species characterized by short transverse relaxation time, T2.

Figure 5:
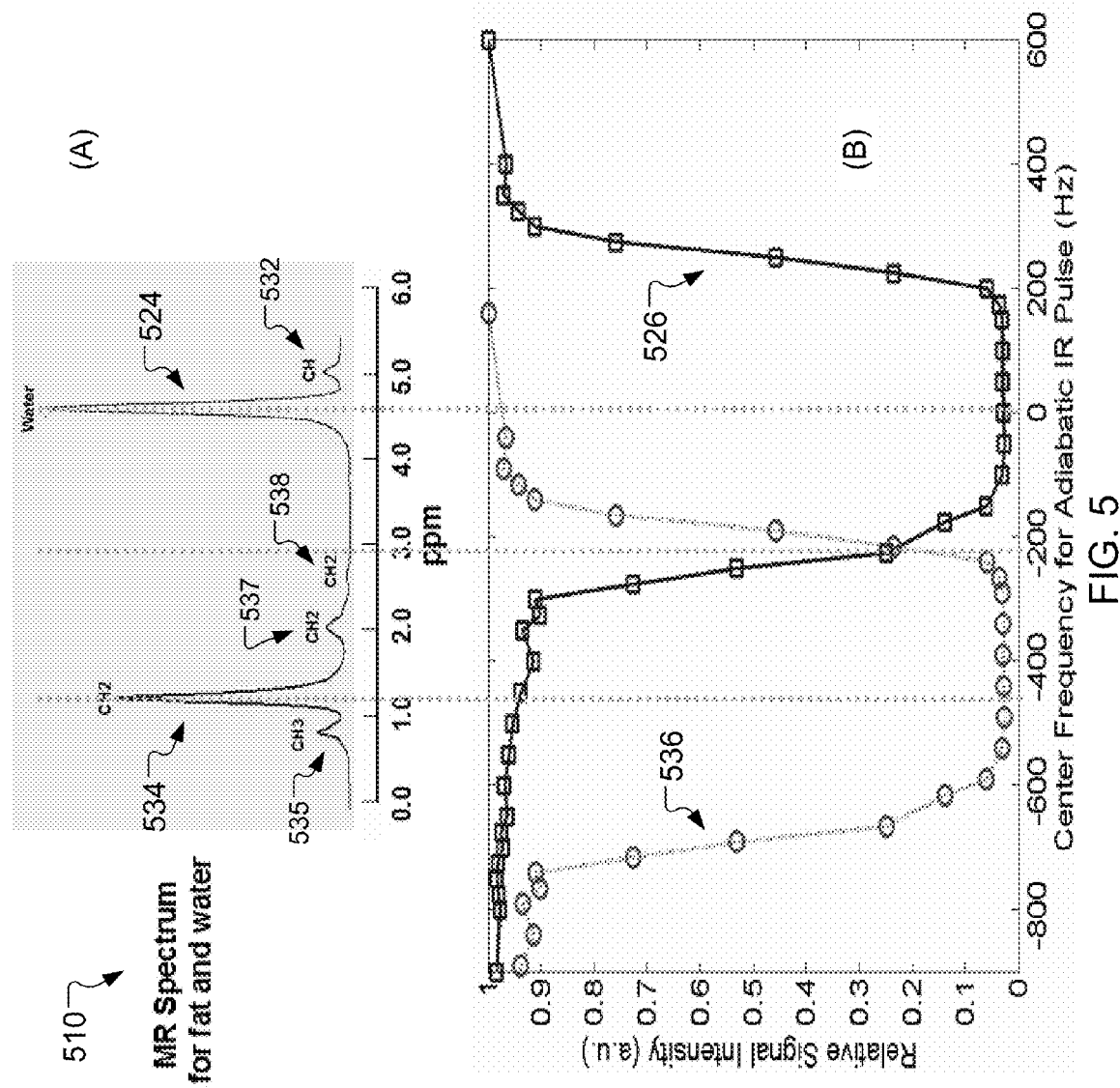
FIG. 5 shows 5(A) an MR spectrum for plant oil and water and 5(B) a spectral profile of a measured adiabatic IR pulse.

FIG. 5 depicts spectral features of the adiabatic inversion pulses. Inset 5(a) shows an MR spectrum 510 for fat and water. The MR spectrum 510 includes five peaks 532, 534, 535, 537 and 538 for fat and one peak 524 for water. Inset 5(b) depicts a spectral profile measured at 3 T of adiabatic IR pulses (of 25 ms in duration). The MR spectrum 510 is reversed from left to right to match the spectral peak of water 524 and the peak of fat (CH2) 534. The MR spectral features 526 and 536 may have a spectral bandwidth of about 500 Hz with sharp transition regions. A spectral feature 526 of an adiabatic IR pulse can be centered at 0 Hz to cover the water peak 524 and the fat (CH) peak 532. Another spectral feature 536 can be centered at −440 Hz to cover fat (CH2) 534, 537 peaks and fat (CH3) peak 535. There may be small spectral overlap between features 526 and 536. Because the DIR UTE technique employs two adiabatic IR pulses to suppress long-T2 water and fat, respectively, any spectral overlap between the two adiabatic IR pulses may lead to imperfect inversion, resulting in long-T2 signal contamination. However, there is only a small CH2 peak 538 in the overlapping region. Therefore, the spectral features 526 and 536 of the two adiabatic IR pulses can provide coverage of the water band 524 and fat band (534, 535, 537), respectively. As shown above, the spectral response of the adiabatic IR pulses as well as the complex spectrum of fat and water may determine the implementations of the techniques disclosed in this specification.

For example, combinations of repetition times (TR) and inversion time intervals (TI), for example 300/130 ms, may null the water signal, if the resonance frequency of water 524 is covered by the spectral feature 526 of an adiabatic IR pulse in the spectral domain. High signal may be achieved even if the center frequency of the adiabatic IR pulse is shifted away from the spectral peak. The spectral response profile 526 of the first adiabatic IR pulse may be measured by detecting signal intensity vs. center frequency, for a series of center frequencies from −800 Hz to +600 Hz. The measured profile 526 of an adiabatic IR pulse with a duration of 25 ms may result in a spectral bandwidth of about 520 Hz with sharp transition regions. The spectral response profile 536 of the second adiabatic IR pulse may be measured in a similar manner.

Figure 6:
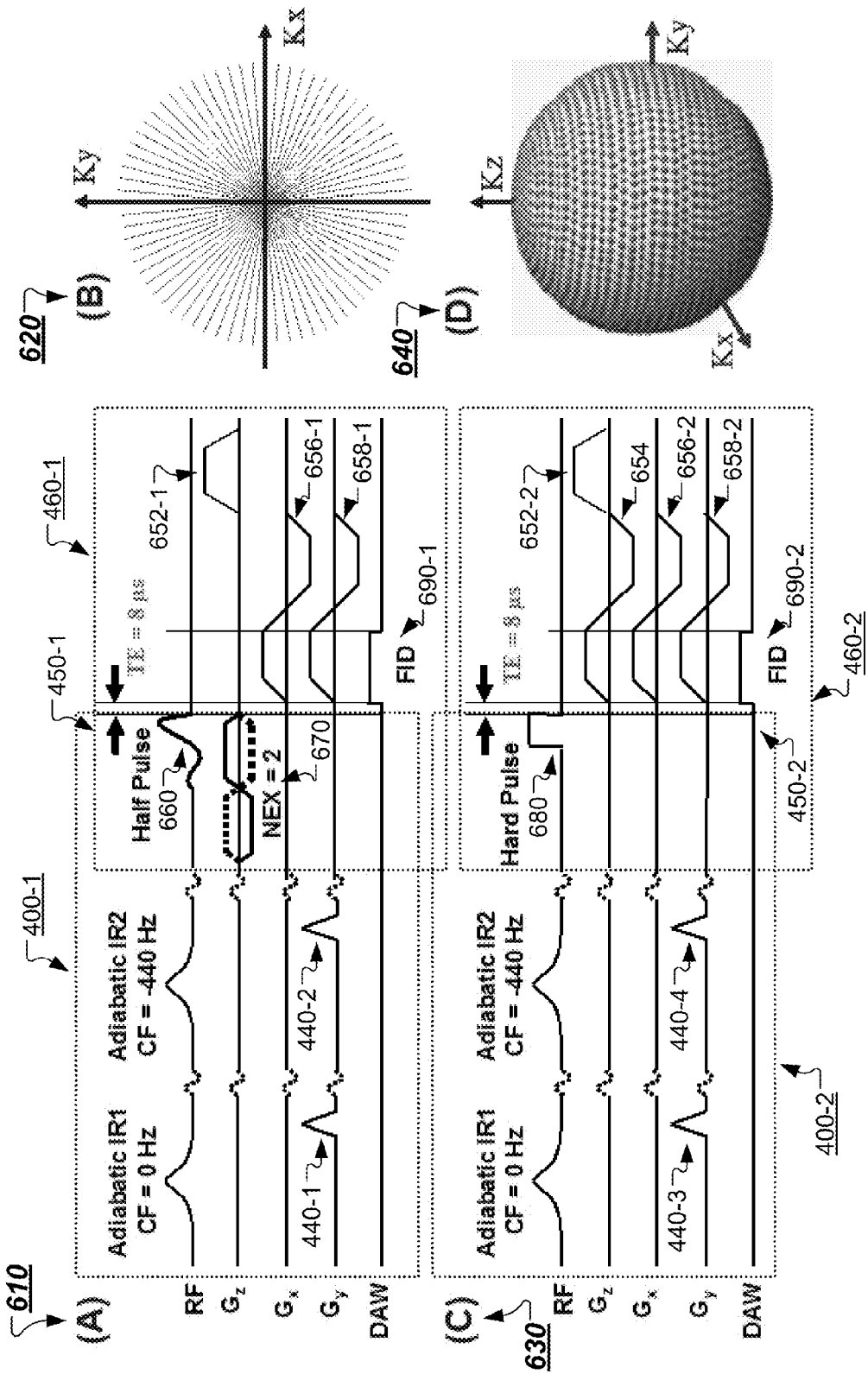
FIG. 6 illustrates in inset 6(A) a two-dimensional (2D) dual inversion recovery UTE (2D DIR UTE) pulse sequence. Inset 6(B) shows 2D DIR UTE k-space trajectories. Inset 6(C) illustrates a three-dimensional (3D) DIR UTE pulse sequence. Inset 6(D) shows the corresponding k-space trajectories.

FIG. 6 illustrates a DIR UTE pulse sequence 610 that can be used to obtain 2D MR images (Insets 6A and 6B), and a DIR UTE pulse sequence 630 that can be used to obtain 3D MR images (Insets 6C and 6D). The DIR UTE pulse sequences 610 and 630 may include dual adiabatic inversion recovery (DIR) preparation sequences 400-1 and 400-2, respectively, for long T2 water and fat suppression. The DIR UTE pulse sequences 610 and 630 may also include UTE excitation and detection sequences 460-1 and 460-2, respectively. Note that time intervals are not depicted proportionally on the time axes of insets 6(A) and 6(C). For example, the time durations of the DIR preparation sequences 400-1 and 400-2 may be longer than 100 ms, while the time durations of the UTE acquisition sequences 460-1 and 460-2 may be shorter than 10 MS.

The DIR UTE pulse sequence 610, for obtaining 2D MR images, may start with a dual inverse recovery (DIR) pulse sequence 400-1. The DIR pulse sequence 400-1 is described with reference to FIGS. 4-5 above. Two adiabatic inversion pulses included in the DIR pulse sequence 400-1 may invert and then null magnetizations corresponding to the long-T2 water and fat protons. Very short-T2 species are largely unaffected due to the significant transverse relaxation during the adiabatic inversion process. Additionally, spoiler gradients 440-1 and 440-2 may be applied after the first and second adiabatic inversion pulses, respectively, to remove residual inversion of nuclear spins of the short T2 species.

Note that time 450-1 is depicted in inset 6(A) as the temporal overlap between the end of preparation stage 400-1 and the beginning of the UTE acquisition stage 460-1. At this time 450-1, portions of the longitudinal magnetization contributed by water and fat, respectively, may simultaneously reach a null value, thus the remaining longitudinal magnetization of the sample may include substantially nuclear spins of the short T2 species.

The UTE acquisition stage 460-1 of the DIR UTE technique 610-1 may begin when a bipolar slice selective gradient 670 is applied to the sample magnetization. The slice selective gradient 670 can be chosen to be bipolar to reduce eddy currents that may contribute noise to the MR images. An RF half-pulse 660 may be applied to excite the nuclear spins of the short T2 species. The half pulse 660 can be synchronized on the second half of the bipolar selective gradient 670 using variable rate selective excitation (VERSE). Two acquisitions (denoted in inset 6(A) as the number of excitations Nex=2) with reversed slice selective gradient polarities are being acquired and summed to form a complete slice profile. Application of fast transmit/receive (T/R) switching may enable free-induction decay (FID) signal detection 690-1 during a reduced detection time (also know as time echo TE) of 8 μs. Bipolar readout gradients 656-1 and 658-1 may be used to reduce eddy currents that may be induced in the sample during FID detection 690-1. The readout gradients 656-1 and 658-1 can be configured for radial ramp sampling. The acquired radial projections may then be rotated to cover k-space 620, as shown in inset 6(B). The projection data may be regridded onto 2D Cartesian grids, which may then be subject to 2D Fourier transformation to generate the UTE images. Returning to inset 6(A), a spoiler gradient 652-1 may be applied to restore the initial magnetization of the sample corresponding to beginning of a DIR UTE pulse sequence 610. The total time duration of the DIR UTE pulse sequence 610 is also known as the repetition time, TR. Multiple repetitions of the DIR UTE sequence 610 may be applied to obtain 2D MR images contributed by the nuclear spins of the species having a short relaxation time, T2.

The DIR UTE pulse sequence 630, for obtaining 3D MR images, may start with a dual inverse recovery (DIR) pulse sequence 400-2. The DIR pulse sequence 400-2 is described with reference to FIGS. 4-5 above. Two adiabatic inversion pulses included in the DIR pulse sequence 400-2 may invert and then null magnetizations corresponding to the long-T2 water and fat protons. Very short-T2 species are largely unaffected due to the significant transverse relaxation during the adiabatic inversion process. Additionally, spoiler gradients 440-3 and 440-4 may be applied after the first and second adiabatic inversion pulses, respectively, to remove residual inversion of nuclear spins of the short T2 species.

Note that time 450-2 is depicted in inset 6(C) as the temporal overlap between the end of preparation stage 400-2 and the beginning of the UTE acquisition stage 460-2. At this time 450-2, portions of the longitudinal magnetization contributed by water and fat, respectively, may simultaneously reach a null value, thus the remaining longitudinal magnetization of the sample may include substantially nuclear spins of the short T2 species.

The UTE acquisition stage 460-2 of the DIR UTE technique 630 may begin when a hard pulse 680 is applied to the sample magnetization to excite the nuclear spins of the short T2 species. Application of fast T/R switching may enable FID signal detection 690-2 during a reduced TE of 8 μs. Bipolar readout gradients 654, 656-2 and 658-2 may be used to reduce eddy currents that may be induced in the sample during FID detection 690-2. The readout gradients 654, 656-1 and 658-1 can be configured for 3D radial ramp sampling. The acquired radial projections may then be rotated to cover the 3D k-space 640, as shown in inset 6(D). The projection data may be regridded onto 3D Cartesian grids, which may then be subject to 3D Fourier transformation to generate the UTE images. Returning to inset 6(C), a spoiler gradient 652-2 may be applied to restore the initial magnetization of the sample corresponding to beginning of a DIR UTE pulse sequence 630. Multiple repetitions of the DIR UTE sequence 630 may be applied to obtain 3D MR images contributed by the nuclear spins of the species having a short relaxation time, T2.

The DIR UTE sequence has been applied to phantom samples, but also to calcified cartilage, Achilles tendon and cortical bone of in vitro samples and healthy volunteers, respectively. The technique disclosed in this specification can be used for imaging of other short T2 tissues, such as the menisci, ligaments, entheses, nervers, short T2 components in brain white matter, and calcification in many human body tissues such as the calcification in carotid plaque.

Figure 7:
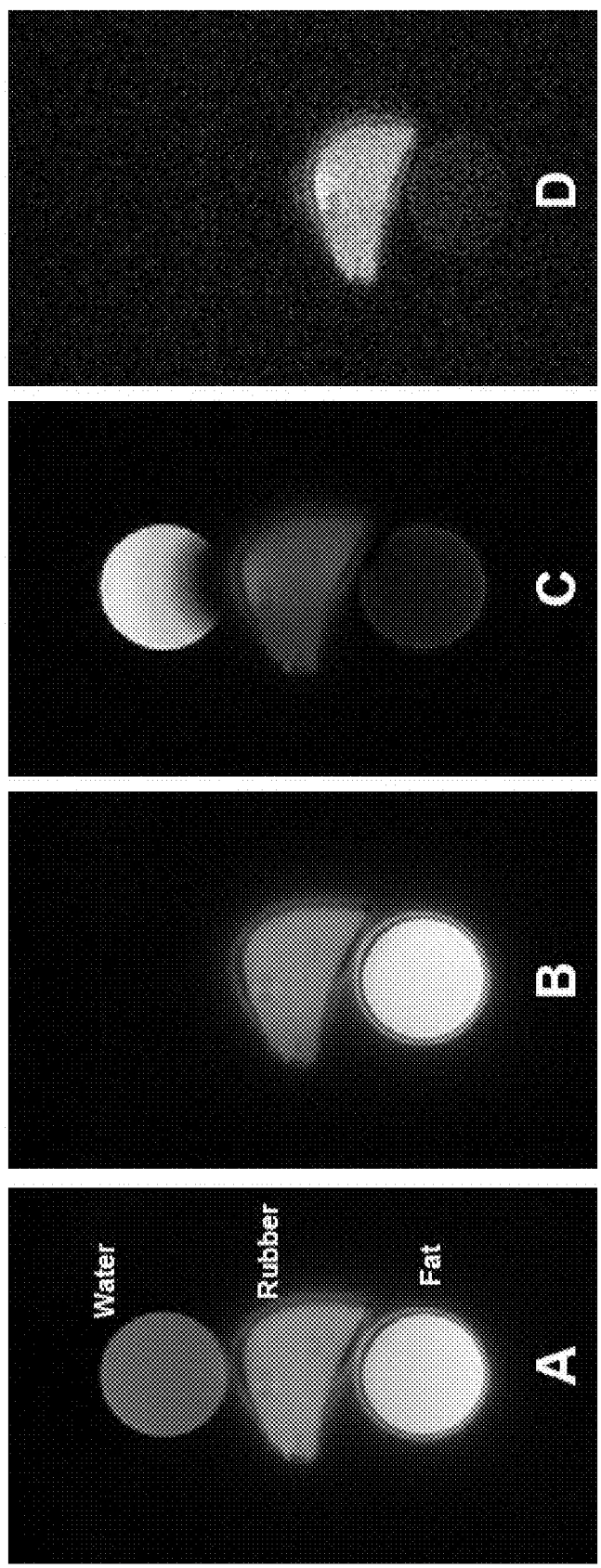
FIG. 7 shows MR imaging of phantom samples.

FIG. 7 illustrates MR images of phantom samples including a tube of water, a tube of fat and a piece of rubber that has a short T2* of 0.77 ms. The MR images of the phantom samples have been obtained by using UTE (Inset 7A), UTE with a single adiabatic inversion pulse focused on either the water peak (Inset 7B) or the fat peak (Inset 7C). The DIR UTE technique has been used to obtain the MR image of the phantom samples in inset 7(D). The ring artifacts surrounding the fat tube and rubber appear due to off-resonance.

A transverse relaxation time, T2*, of 0.77 ms has been measured for the rubber-band phantom. The measured value of T2* is significantly shorter than the values of 40 and 30 for water and fat, respectively. As shown in inset 7(A), the UTE sequence can provide high signal from the nuclear spins of water, fat and rubber. Inset 7(B) illustrates that an adiabatic IR pulse centered on the water peak (0 Hz) can selectively null the water signal, for a TR of 300 ms and TI of 130 ms. Inset 7(C) illustrates that an adiabatic IR pulse centered on the fat peak (−440 Hz) can selectively suppress the fat signal, for a TR of 300 ms and a TI of 85 ms. Additionally, inset 7(C) shows a residual fat signal, corresponding to —CH=CH— 532 which is located at 5.3 parts-per-million (ppm) and is not inverted by the adiabatic IR pulse.

Inset 7(D) shows an MR image acquired using the DIR UTE sequence with a TR of 300 ms, TI1 of 130 ms and TI2 of 85 ms for water and fat, respectively. The MRI setting corresponding to inset 7(D) can selectively suppress water and fat signals and can produce an image of the rubber phantom sample that may have higher contrast in comparison to insets 7(A)-7(C). The fat peaks (—CH=CH—CH2-CH=CH— at 2.75 ppm, —CH2-CO— at 2.20 ppm, and —CH2-CH=CH— at 2.02, and the double bond fat peak —CH=CH— at 5.3 ppm) may be suppressed by the two adiabatic inversion pulses. The ringing artifacts around the oil tube and the rubber tube may be due to off-resonance effects in radial imaging, and can be suppressed through a multi-frequency reconstruction scheme.

Figure 8:
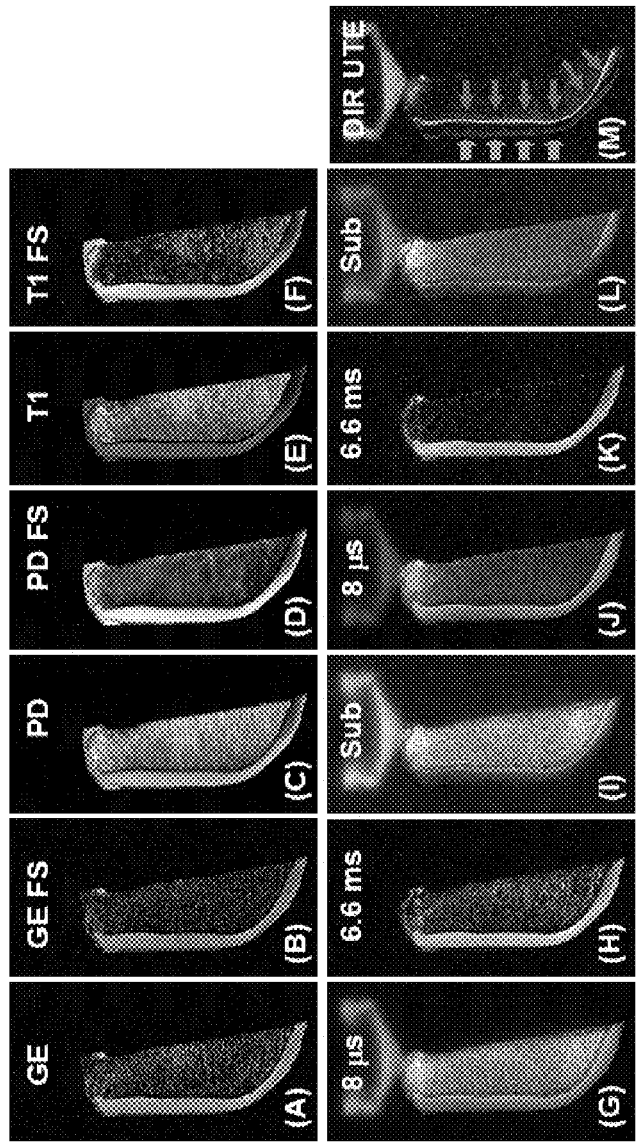
FIG. 8 shows axial imaging of a patella acquired using a 2-dimensional radial ramp sampling with 8(A) clinical gradient echo, 8(B) GE with fat saturation, 8(C) PD FSE, 8(D) PD FSE with FS, 8(E) T1 FSE, 8(F) T1 FSE with FS, 8(G) UTE with a TE of 8 µs and 8(H) UTE with a TE of 6.6 ms, 8(I) subtraction of the second echo from the first echo, 8(J) fat saturated UTE with a TE of 8 µs, 8(K) fat saturated UTE with a TE of 6.6 ms, 8(L) fat saturated UTE with a TE of 6.6 ms with the corresponding later echo subtraction, and 8(M) DIR UTE pulse sequences.
Figure 8:
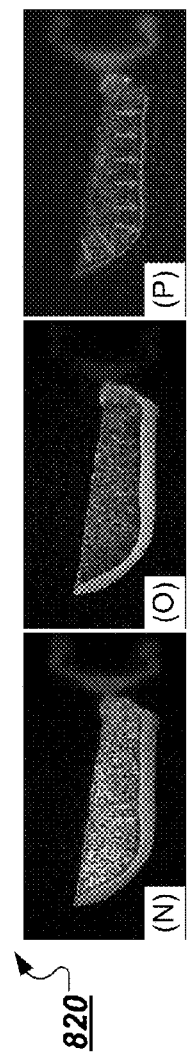

FIG. 8 shows axial MR images of a patellar cadaveric slice obtained from a human knee specimen. Some of the MR images 810 (in insets 8A-M) are obtained using a 2D radial ramp sampling, while the other MR images 820 (in insets 8N-P) are obtained using a 3D radial ramp sampling. Further, the MR images were acquired using (8A) clinical gradient echo, (8B) GE with fat saturation, (8C) PD FSE, (8D) PD FSE with FS, (8E) T1 FSE, (8F) T1 FSE with FS, (8G) and (8N) UTE with a TE of 8 μs, and (8H) UTE with a TE of 6.6 ms, (8I) subtraction of the second echo from the first echo, (8J) and (8O) fat saturated UTE with a TE of 8 μs, (8K) fat saturated UTE with a TE of 6.6 ms, (8L) fat saturated UTE with a TE of 6.6 ms with the corresponding later echo subtraction, and (8M) and (8P) DIR UTE pulse sequences.

The 2D DIR UTE pulse sequence (described relative to FIG. 6, insets 6A and 6B) used to obtain the MR images 810, in insets 8(A)-8(M), can have TR of 300 ms, TI1 of 75 ms and TI2 of 130 ms. The imaging parameters may be an field of view (FOV) of 8 cm, a slice thickness of 0.7 mm and a readout length of 512 result in an acquired voxel size of 0.16×0.16× 0.7 mm3, to provide high resolution imaging of the patella with a total scan time of 6 minutes. Images of deep radial and calcified layers of cartilage may be absent from the PD-FSE (Insets 8C, 8D), T1-FSE (Insets 8E, 8F) and GE (Insets 8A, 8B) images. The UTE sequence (Insets 8G-8L) can image a high signal line, representing the deep radial cartilage and calcified layers of cartilage. However, there is limited contrast between the deep layers and superficial layers of articular cartilage (Insets 8G-8L). The DIR UTE sequence can selectively suppress signals from both fat and the superficial layers of articular cartilage, providing a signal-to-noise-ratio (SNR) of 15.6±3.8 for the deep layers of cartilage, a contrast-to-noise-ratio (CNR) of 10.7±3.2 between the deep layers and superficial layers of articular cartilage, and a CNR of 10.0±2.5 between the deep layers of cartilage and fatty marrow. Compared to UTE imaging, DIR UTE can increase the contrast between the deep layers and superficial layers of cartilage by a factor of 5.8, and the contrast between the deep layers of cartilage and bone marrow fat by a factor of 4.2.

Considering partial volume effects both in-plane and through-plane when imaging the thin layer of calcified cartilage (CC) which is around 0.1 mm thick, the high signal line (Inset 8M) may represent a combination of signals from the deepest radial zone and CC.

The 3D DIR UTE pulse sequence (described relative to FIG. 6, insets 6C and 6D) can employ a short hard pulse 680 (80 μs in duration) for signal excitation followed by 3D radial ramp sampling 460-2. The DIR preparation pulses 420-2 and 430-2 may be applied before the 3D UTE acquisition 460-2 to invert and null long T2 proton water and fat magnetization. The 3D DIR UTE sequence 630 applied to the patella sample to obtain the MR images 820, in insets 8N-P, can have the following imaging parameters: FOV of 8 cm, readout of 384 (224 sampling points), sampling bandwidth (BW) of ±62.5 kHz, TR of 300 ms, TI1=75 ms, TI2=130 ms, TE of 8 μs, 40,000 projections, 1 number of excitations (NEX). The 3D DIR UTE pulse sequence 630 provides isotropic spatial coverage and spatial resolution with a voxel size of 0.2×0.2×0.2 mm3, and a total scan time of about 3.3 hours. The 3D DIR UTE provides excellent image contrast for the deepest radial cartilage and ZCC with excellent suppression of the superficial layers of cartilage and bone marrow fat, as illustrated in inset 8(P). The high isotropic resolution virtually eliminates partial volume artifacts associated with 2D DIR UTE 610 imaging. The 3D DIR UTE 630 imaging may be time consuming. Therefore the 3D DIR UTE pulse sequence 630 may be used for confirmation/validation of results obtained with 2D DIR UTE 610 imaging, and may be useful for patient use at a later stage.

Figure 9:
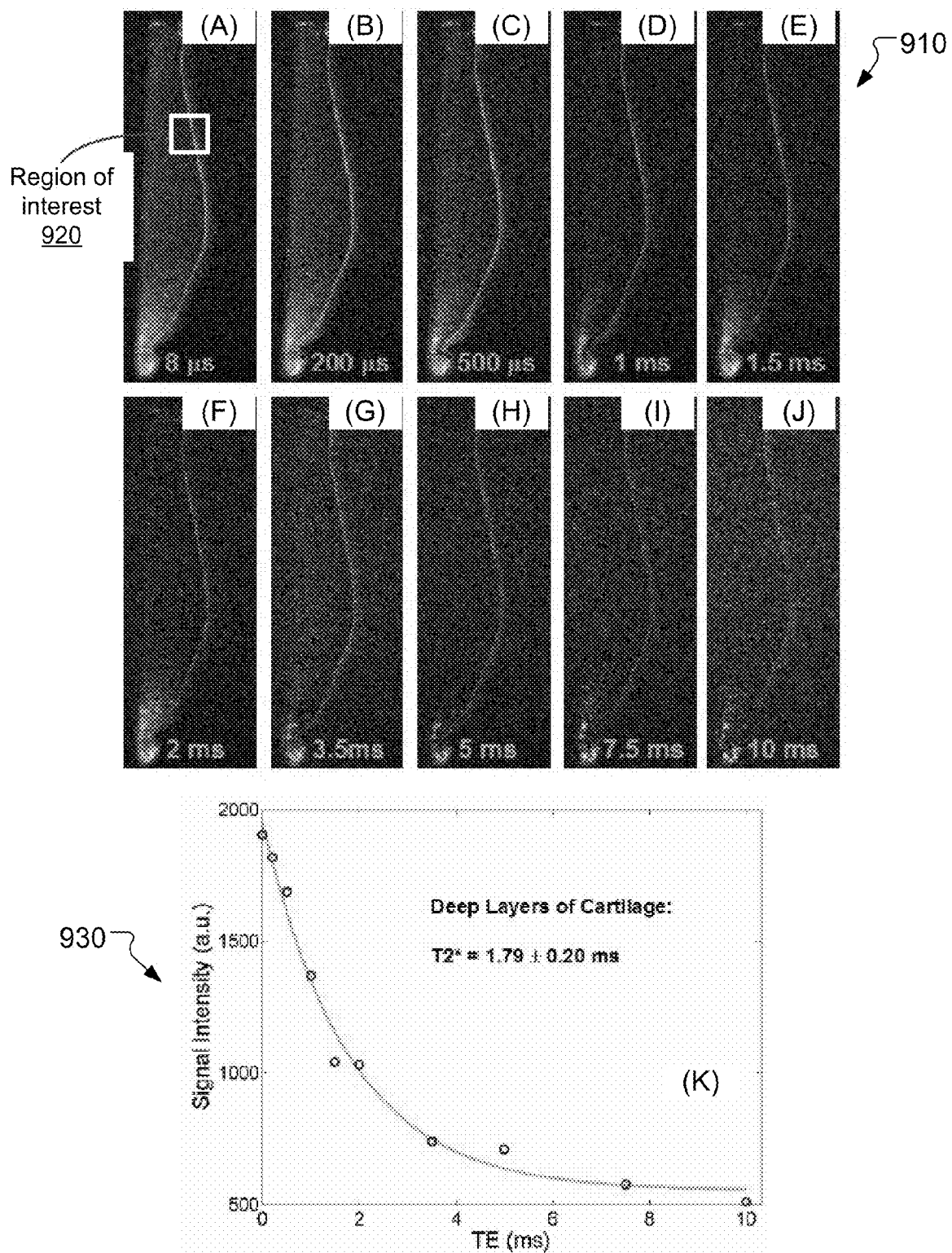
FIG. 9 illustrates DIR UTE imaging of a patella chip at progressively increasing TEs ranging from 8 µs (Inset 9A) to 10 ms (Inset 9J). Inset 9(K) shows a single component exponential fitting to the decay curve derived from DIR UTE images at variable TEs, shown in Insets 9(A)-9(J).

FIG. 9 shows how the DIR UTE sequence 610 can be used to quantify T2* of the short T2 tissues, such as ZCC. The MR images 910 in insets 9(A)-9(J) show DIR UTE 610 imaging of a patella chip at progressively increasing delay times TE, ranging from 8 μs to 10 ms. A region-of-interest (ROI) 920 is selected in the high signal line, and the signal intensity corresponding to the ROI 920 may be measured for each delay time TE. The parameter T2* can be determined through exponential fitting to the signal decay curve derived from ROIs corresponding to the DIR UTE images 910 acquired at variable TEs. A single component exponential decay model may be employed. The graph in inset 9(K) shows the decay curve, and its determined T2* of 1.8 ms for the deep layers of cartilage.

Other techniques for quantifying the relaxation times T1 and T2 of a tissue may not be usable for short T2 tissues, because the magnetization corresponding to the short T2 species experience significant decay during the adiabatic inversion pulses 422, 432. A short duration pulse may accurately tip the short T2 spins. In addition, efficient suppression of long T2 water and fat signal may be needed for reducing CNR, i.e., contributions from the long T2 tissues to the signal from the short T2 tissues.

Figure 10E:
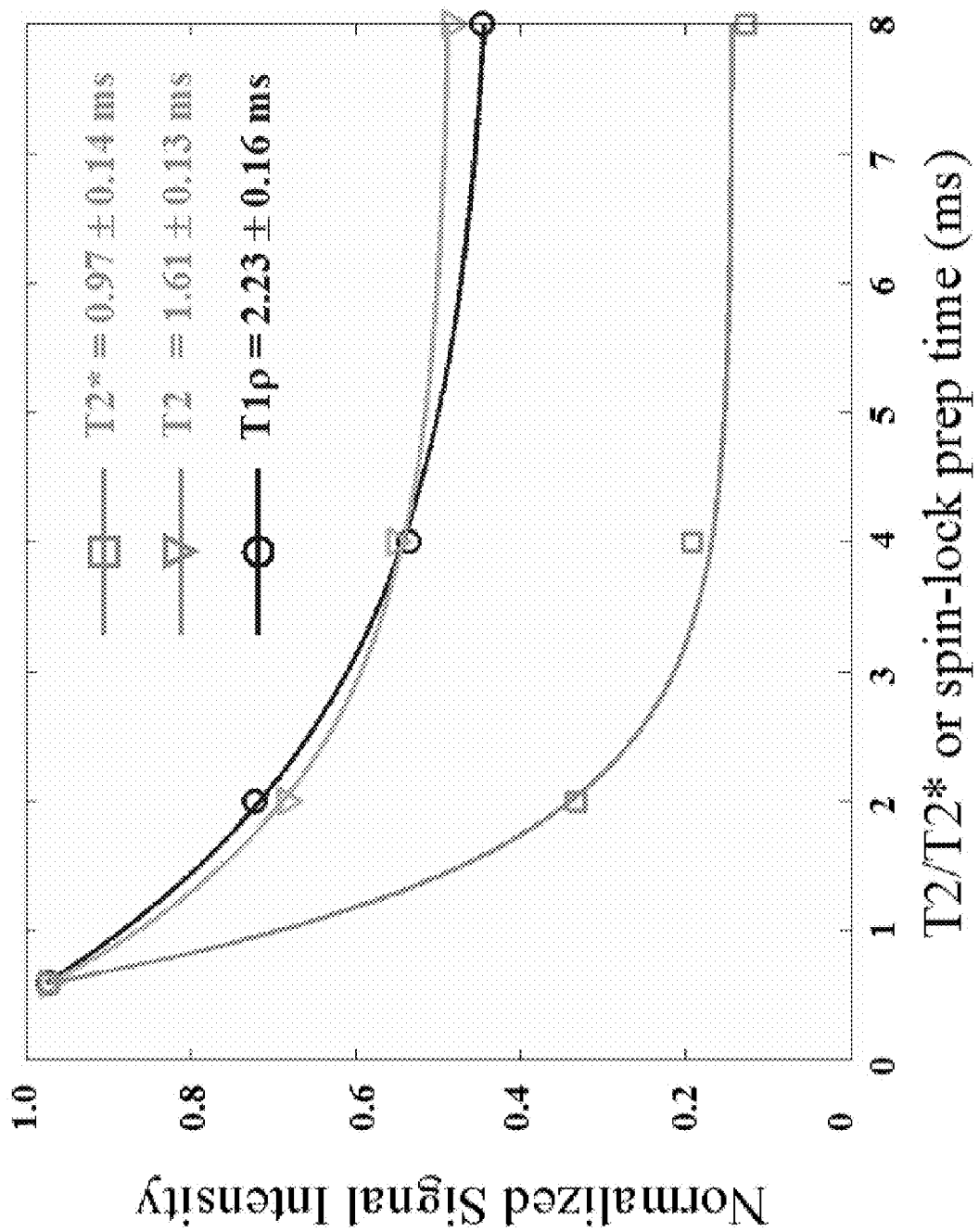
FIG. 10 shows techniques for quantifying material parameters $10(a)$ T1, $10(b)$ T2*, $10(c)$ T2 and $10(d)$ T1ρ. Inset $10(e)$ shows single component exponential curve fitting of T2*, T2 and T1ρ parameters measured using DIR UTE images of a patella sample.

FIG. 10 illustrates techniques that can be used, for example, for quantifying the MR parameters of the ZCC. Inset 10(*a*) depicts a pulse sequence 1010 used for T1 quantification: The pulse sequence 1010 may be based on a saturation recovery DIR UTE technique. The pulse sequence 1010 may combine the DIR preparatory sequence 400-1 with a short hard 90° x pulse (232 μs) to saturate the ZCC magnetization. The pulse sequence 1010 may also include an UTE acquisition 460-1 at a series of saturation recovery times (TSR) to detect the longitudinal recovery T1 of ZCC.

Inset 10(*b*) shows a pulse sequence 1020 used for T2* quantification: The pulse sequence 1020 may be based on a T2*-prepared DIR UTE technique. The pulse sequence 1020 may combine the DIR preparatory sequence 400-2 with a short hard 90° x pulse to tip the ZCC magnetization into the transverse plane. The transverse component of the ZCC magnetization may undergo a T2* decay and may be tipped back into the longitudinal axis by a short −90° x pulse. The pulse sequence 1020 may also include an UTE acquisition 460-2, succeeding the series of T2* preparation pulses (T2* prep), to measure the T2* parameter of ZCC.

Inset 10(c) shows a pulse sequence 1030 used for T2 quantification: The pulse sequence 1030 may be based on a T2-prepared DIR UTE technique. The pulse sequence 1030 may combine the DIR preparatory sequence 400-3 with a short hard 90° x pulse to tip the ZCC magnetization to the transverse plane. The ZCC magnetization in the transverse plane may be (re)focused by a short hard 180° (464 µs) pulse and then tipped back along the longitudinal axis by a short −90° x pulse. The pulse sequence 1030 may also include an UTE acquisition 460-3, succeeding the series of T2 preparation pulses (T2 prep), to allow for accurate T2 quantification of ZCC.

Inset 10(d) shows a pulse sequence 1040 used for T1ρ quantification: The pulse sequence 1030 may be based on a T1ρ-prepared DIR UTE technique. The pulse sequence 1040 may combine the DIR preparatory sequence 400-4 with a short hard 90° x pulse to tip the ZCC magnetization in the transverse plane. The ZCC magnetization in the transverse plane may be spin-locked by a hard pulse and tipped back to the longitudinal axis by a short −90° x pulse. The pulse sequence 1040 may also include an UTE acquisition 460-4, succeeding a spin-locking time (TSL) may allow for accurate T1ρ quantification.

Features that apply to the DIR UTE quantification techniques 1010, 1020, 1030 and 1040 may include (i) using DIR preparation pulses 400 to suppress long T2 water and fat signal, (ii) use the shortest hard 90° x (232 µs) or 180° (464 µs) pulse to achieve accurate saturation or inversion, and (iii) use UTE 460 data collection to detect signal from the ZCC.

Inset 10(e) shows results from T2*, T2 and T1ρ quantification performed on a patella using a 2D DIR UTE 610 acquisition combined with preparation pulses included in pulse sequences 1020, 1030 and 1040. Quantification errors due to long T2 contamination may be minimized by the DIR preparatory sequence 400 which can suppress signal contributions from the superficial layers of cartilage and bone marrow fat. In this example, imaging parameters included: FOV=8 cm, readout=512, 599 projections, slice thickness=0.7 mm, BW=±62.5 kHz, TR=300 ms, TI1=75 ms, TI2=130 ms, preparation time (T2* or T2 preparation or spin-locking preparation)=0.6 ms, 2 ms, 4 ms and 8 ms, NEX=2, total quantification time ~24 minutes. A short T2* of 0.97±0.14 ms may be determined for the deepest radial cartilage and the ZCC through a single exponential component curve fitting which can account for 98.5% of the signal variance as shown in inset 10(e). Meanwhile, a short T2 of 1.61±0.13 ms and short T1ρ of 2.23±0.16 ms may be determined for the ZCC through exponential curve fittings which may account for more than 99% of the signal variance.

Figure 11:
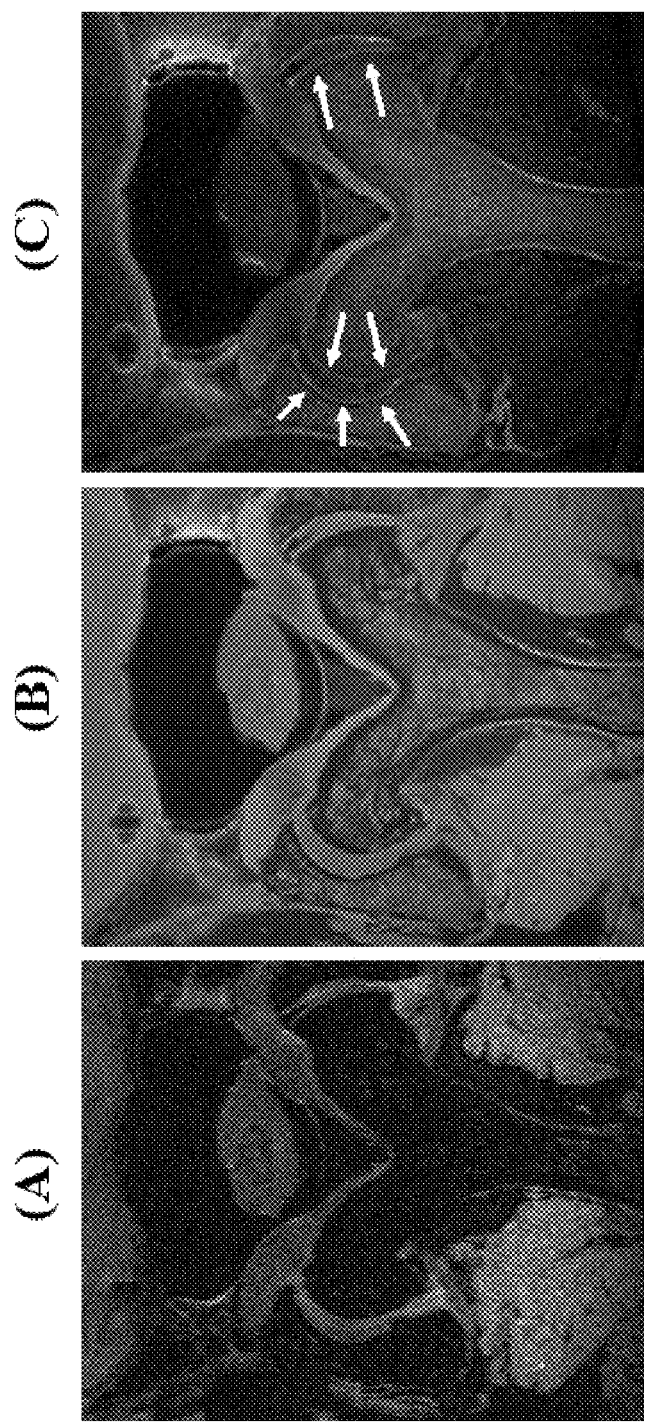
FIG. 11 shows MR images of an axial cadaveric lumbar spine sample using PD-FSE 11(A), regular UTE 11(B) and DIR UTE 11(C) sequences, respectively.
Figure 12:
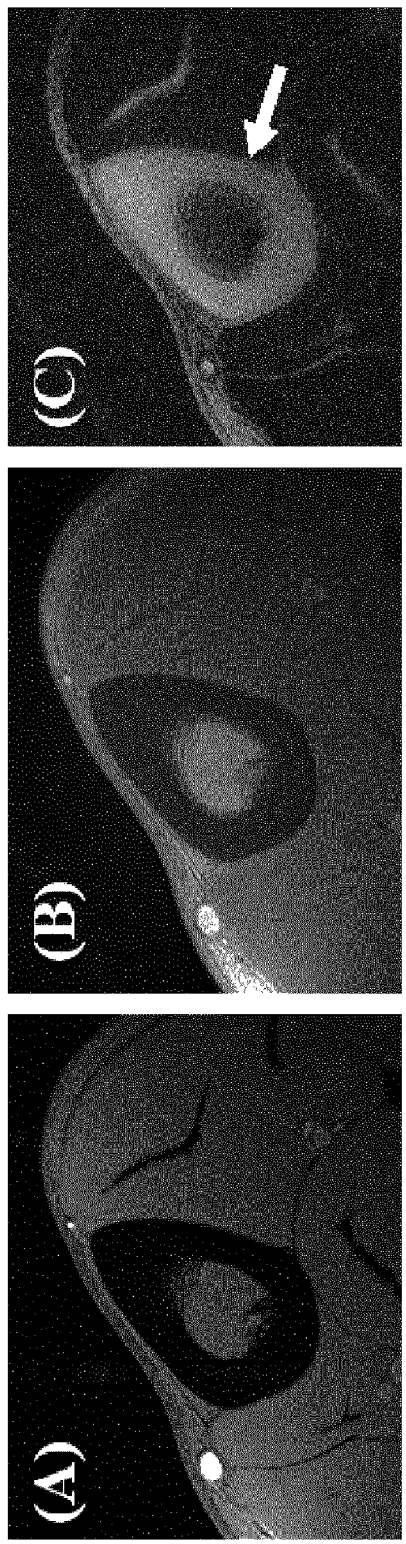
FIG. 12 shows axial MR images through the mid-tibia of a healthy volunteer using 12(A) gradient echo sequence, 12(B) conventional UTE and 12(C) DIR UTE sequences, respectively.
Figure 13:
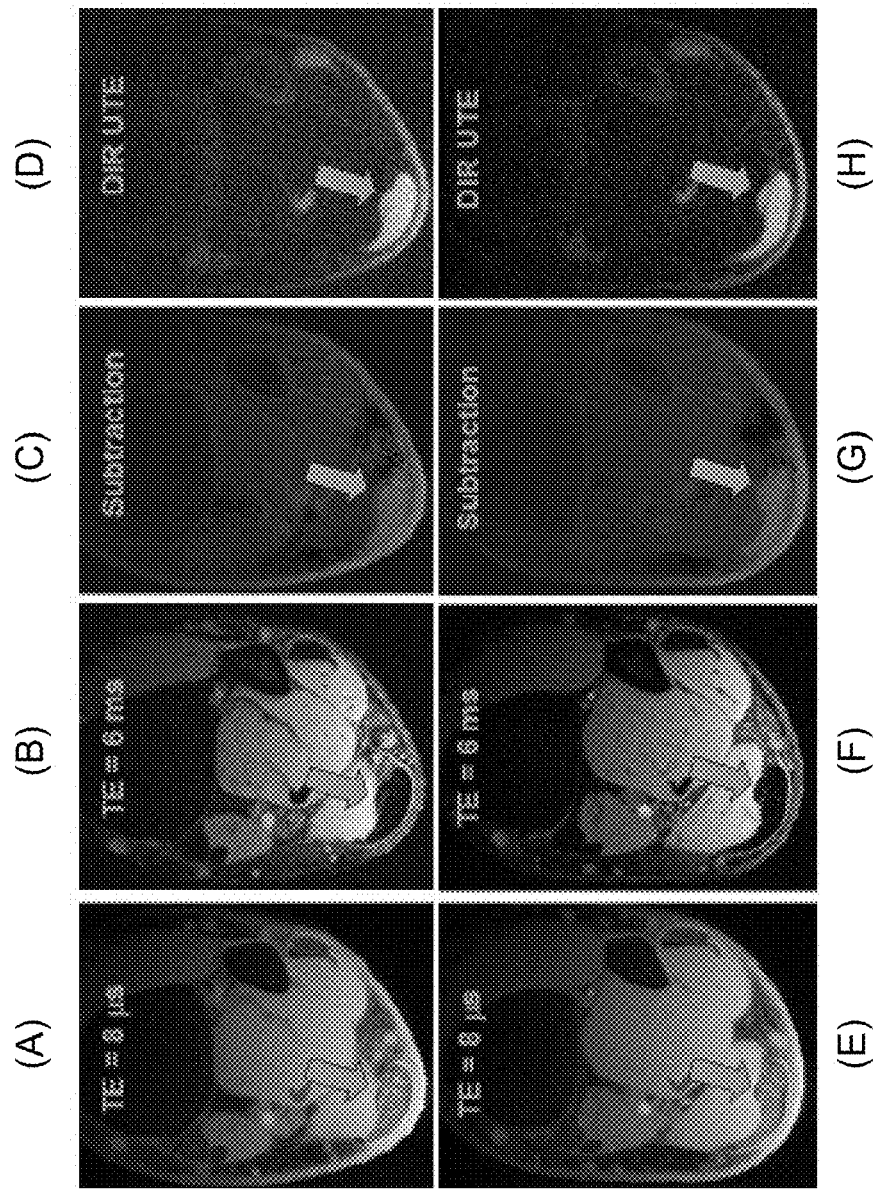
FIG. 13 shows MR images of an Achilles tendon of a healthy volunteer using dual echo UTE acquisition with a TE of 8 µs (Insets 13A, 13E) and 6 ms (Insets 13B, 13F), dual echo UTE acquisition with echo subtraction (Insets 13C, 13G), and DIR UTE sequence (Insets 13D, 13H), respectively.

Other examples of MR imaging using the techniques and systems disclosed in this specification are presented in reference to FIGS. 11-13. For example, FIG. 11 shows MR images of an axial cadaveric lumbar spine sample using (A) PD-FSE, (B) UTE, and (C) DIR UTE sequences, respectively. The acquisition parameters include: FOV=8 cm, slice thickness=0.7 mm, readout=512 (272 sampling points), number of projections=599, TR=300 ms, TI1=120 ms, TI2=75 ms, TE=8 µs, bandwidth=±62.5 kHz, voxel size of 0.1×0.1×0.7 mm3. As illustrated in inset 11(A), the PD-FSE sequence may provide limited information on the short T2 tissues, including the deep layers of cartilage, periosteum, and fibrocartilage. Inset 11(B) depicts that UTE imaging can provide high signal for the forgoing short T2 tissues. However, there is little image contrast (CNR<1) for the deep layers of cartilage due to the high signal from superficial layers of cartilage. As shown in inset 11(C), the DIR UTE technique can selectively suppress signals from marrow fat and superficial layers of cartilage, and may provide ultrahigh image contrast, CNR of 9.8±2.1, between the deep layers and superficial layers of cartilage.

FIG. 12 shows axial MR images through the mid-tibia of a healthy volunteer using (A) gradient echo sequence, (B) UTE, and (C) DIR UTE sequences, respectively. The left distal tibia was imaged with the following acquisition parameters: FOV=10 cm, slice thickness=5 mm, readout=512 (272 sampling points), number of projections=511, TR=300 ms, TI1=120 ms, TI2=80 ms, TE=8 µs, bandwidth=±62.5 kHz, scan time=5 minutes. Cortical bone shows as signal void in the MR image acquired using the 2D GE sequence (Inset 12A). Cortical bone shows limited contrast in the MR image acquired with the UTE sequence (Inset 12B) due to the high signal from the surrounding muscle and fat tissues. DIR UTE sequence can suppress both fat and muscle signals, and can produce high contrast image for the cortical bone (Inset 12C).

FIG. 13 shows MR images of the Achilles tendon of a healthy volunteer using dual echo UTE acquisition with a TE of 8 µs (Insets 13A, 13E) and 6 ms (Insets 13B, 13F), and DIR UTE sequence (Insets 13D, 13H), respectively. High resolution images can be generated with a FOV of 10 cm, a slice thickness of 3 mm, a readout of 512, a TR of 300 ms and 299 projections, resulting in an acquired voxel size of 0.2×0.2×3.0 mm3 under a total scan time of 3 minutes, in this example. A delay time of 120 ms for the first adiabatic IR pulse and 85 ms for the second adiabatic IR pulse may provide excellent suppression of long T2 signals from muscle and fat (Insets 13D, 13H). In this example, echo subtraction (Insets 13C, 13G) can reduce long T2 muscle and fat signals, increasing contrast for the Achilles tendon. However, the residual long T2 signals can limit the contrast for tendon, in this example. DIR UTE can selectively reduce signals from fat and muscle, creating higher contrast for the Achilles tendon (arrows in insets 13D, 13H).

As described above, DIR UTE may suppress long T2 water signals and fat signals simultaneously, providing excellent image contrast for the short T2 tissues, including the deep radial and calcified layers of articular cartilage, cortical bone and Achilles tendon. The DIR UTE technique relies on the following four factors. First, an ultrashort TE of 8 µs may allow the detection of tissues with short T2 relaxation times, such as cortical bone with a T2* of around 400 µs. Second, long adiabatic inversion pulses may allow robust inversion of long T2 tissues even under inhomogeneous B1 field. Third, long duration adiabatic inversion pulses may prevent complete inversion of the magnetization of short T2 tissues, which experience significant transverse relaxation during the long inversion process. Adiabatic inversion pulses with longer duration and narrower bandwidth allows less attenuation of short T2 signals. Fourth, proper combination of TR, TI1 and TI2 allows simultaneous nulling of both long T2 water and fat signals.

The two adiabatic inversion pulses are applied at two distinct resonance frequencies, such as water peak at 0 Hz and fat peak at −440 Hz. Furthermore, the spectral profiles of the two adiabatic pulses are separated distinctly without any overlap. In some cases, overlap between the two spectral profiles may cause partially reversion of the long T2 tissues, resulting in imperfect signal nulling. Bloch simulation shows that long adiabatic inversion hyperbolic secant pulses with a duration of around 17 ms have a sharp transition band with a spectral bandwidth of around 200 Hz. Therefore, there is little overlap by placing one pulse at 0 Hz and one at −440 Hz. To further minimize the possibility of spectral overlapping, the first adiabatic inversion pulse can be shifted to a positive resonance frequency, such as 100 Hz, and/or shift the second adiabatic inversion pulse to further negative, such as −500 to −600 Hz.

Although a few variations have been described in detail above, other modifications are possible. For example, the logic flow depicted in the accompanying figures and described herein does not require the particular order shown, or sequential order, to achieve desirable results.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, variations and enhancements of the disclosed implementations and other implementations can be made based on what is described and illustrated in this specification.

What is claimed is:

1. A method performed by a magnetic resonance imaging system, the method comprising:
   preparing a magnetization of species within a sample;
   selectively modifying, for a select period of time, the prepared magnetization
      to suppress, at a given time, a component of the modified magnetization corresponding to two or more of the species having long transverse relaxation times, T2, and
      to identify, at the given time, a component of the modified magnetization corresponding to at least one of the species having a short transverse relaxation time, T2,
      wherein each short T2 is shorter than the select period of time, and the select period of time is shorter than each long T2;
   exciting, at the given time, the identified component of the modified magnetization corresponding to the at least one short T2 species; and
   detecting radio frequency (RF) emissions corresponding to relaxation of the excited magnetization corresponding to the at least one short T2 species.

2. The method of claim 1, further comprising:
   converting the detected RF emissions into an image contributed by the excited magnetization corresponding to the at least one short T2 species.

3. The method of claim 1, wherein selectively modifying, for the select period of time, the prepared magnetization to suppress, at the given time, the component of the modified magnetization corresponding to the two or more long T2 species, comprises:
   for each of the two or more long T2 species, selectively inverting a corresponding magnetization component by applying, at a respective inversion initiation time, a respective adiabatic inversion pulse centered at a respective resonant frequency, wherein:
      a respective duration of the respective adiabatic inversion pulse is selected to be shorter than or equal to the select period of time;
      the inverted corresponding magnetization component reaches zero value after a respective inversion time interval measured from the respective inversion initiation time; and
      the inversion initiation times are selected such that the inversion time intervals end at the given time to suppress the component of the modified magnetization corresponding to the two or more long T2 species.

4. The method of claim 3, wherein selectively modifying, for the select period of time, the prepared magnetization to identify, at the given time, the component of the modified magnetization corresponding to the at least one short T2 species, comprises:
   selectively maintaining an orientation of a component of the prepared magnetization corresponding to the at least one short T2 species by applying the adiabatic inversion pulses, wherein the durations of the adiabatic inversion pulses are selected to be longer than each short T2.

5. The method of claim 1, wherein exciting the identified component of the modified magnetization further comprises:
   selecting a portion of the sample; and
   exciting the identified component of the modified magnetization of the selected portion of the sample.

6. The method of claim 1, wherein preparing the magnetization of the species within the sample comprises orienting nuclear spins of the species in a uniform magnetic field.

7. A magnetic resonance imaging system comprising:
   a scanner comprising a magnet, gradient coils and a radio frequency (RF) transceiver to perform operations comprising:
      prepare a magnetization of species within a sample;
      selectively modify, for a select period of time, the prepared magnetization
         to suppress, at a given time, a component of the modified magnetization corresponding to two or more of the species having long transverse relaxation times, T2, and
         to identify, at the given time, a component of the modified magnetization corresponding to at least one species having a short transverse relaxation time, T2,
         wherein each short T2 is shorter than the select period of time, and the select period of time is shorter than each long T2;
      excite, at the given time, the identified component of the modified magnetization corresponding to the at least one short T2 species; and
      detect RF emissions corresponding to relaxation of the excited magnetization corresponding to the at least one short T2 species; and
   a data processor in communication with the scanner to perform operations comprising:
      receive the detected RF emissions; and
      convert the received RF emissions into an image contributed by the excited magnetization corresponding to the at least one short T2 species.

8. The system of claim 7, wherein the scanner to selectively modify the prepared magnetization to suppress, at a given time, a component of the modified magnetization corresponding to two or more of the long T2 species, is further configured to perform operations comprising:

for each of the two or more long T2 species, selectively invert a corresponding magnetization component by applying, at a respective inversion initiation time, a respective adiabatic inversion pulse centered at a respective resonant frequency, wherein:
- a respective duration of the respective adiabatic inversion pulse is selected to be shorter than or equal to the select period of time;
- the inverted corresponding magnetization component reaches zero value after a respective inversion time interval measured from the respective inversion initiation time; and
- the inversion initiation times are selected such that the inversion time intervals end at the given time to suppress the component of the modified magnetization corresponding to the two or more long T2 species.

9. The system of claim 8, wherein the scanner to selectively modify the prepared magnetization to identify, at the given time, a component of the modified magnetization corresponding to at least one short T2 species, is further configured to perform operations comprising:
selectively maintain an orientation of a component of the prepared magnetization corresponding to the at least one short T2 species by applying the adiabatic inversion pulses, wherein the durations of the adiabatic inversion pulses are selected to be longer than each short T2.

10. The system of claim 8, wherein:
the two or more species having long T2 comprise water and fat.

11. The system of claim 10, wherein:
the adiabatic inversion pulse to selectively invert the component of the modified magnetization corresponding to water is centered at 0 Hz, and has a duration of 17-25 ms and a spectral bandwidth of 200-500 Hz; and
the adiabatic inversion pulse to selectively invert the component of the modified magnetization corresponding to fat is centered at −440 Hz, and has a duration of 17-25 ms and a spectral bandwidth of 200-500 Hz.

12. The system of claim 11, wherein:
the adiabatic inversion pulse to selectively invert the component of the modified magnetization corresponding to water is spectrally shifted from at 0 Hz to 100 Hz; and
the adiabatic inversion pulse to selectively invert the component of the modified magnetization corresponding to fat is spectrally shifted from −440 5 Hz to −500 Hz or to −600 Hz.

13. The system of claim 7, the scanner to excite the modified magnetization is further configured to perform operations comprising:
select a portion of the sample; and
excite the identified component of the modified magnetization of the selected portion of the sample.

14. The system of claim 13, the scanner to excite the identified component of the modified magnetization of the selected portion of the sample is further configured to perform operations comprising:
select the portion of the sample by applying a bipolar slice selective gradient; and
apply an RF half-pulse to excite the identified component of the modified magnetization of the selected portion of the sample,
wherein the RF half-pulse is synchronized on a second half of the applied bipolar slice selective gradient.

15. The system of claim 14, the scanner to detect RF emissions is configured to perform operations comprising:
acquire a free-induction decay (FID) signal after a time echo (TE) from the application of the RF half-pulse, wherein:
the acquired FID signal corresponds to relaxation of the excited identified component of the magnetization of the selected portion of the sample; and
the TE is 8 µs or more; and
apply bipolar readout gradients configured for FID signal acquisition along radial projections of k-space.

16. The system of claim 15, the data processor to convert the detected RF emissions into an image contributed by the excited magnetization within the selected 5 portion of the sample, is configured to perform operations comprising:
sum FID signals acquired along radial projections of k-space to obtain projection data of the selected portion of the sample;
regrid the projection data of the selected portion of the sample onto Cartesian grids; and
obtain an MR image of the selected portion of the sample by applying a Fourier transformation to the regridded projection data of the selected portion of the sample.

17. The system of claim 7, wherein the magnet to orient nuclear spins of the species in a uniform magnetic field to prepare the magnetization of the species within the sample.

18. The system of claim 7, wherein:
the scanner is configured to perform operations comprising:
saturate the identified component of the modified magnetization corresponding to the at least one short T2 species, by applying a hard 90° x pulse shorter than the short T2;
detect, after each of a series of saturation recovery time periods, a corresponding signal proportional to a longitudinal relaxation of the saturated magnetization; and
the data processor to identify a longitudinal relaxation time, T1, corresponding to the short T2 species, based on the detected signals.

19. The system of claim 7, wherein:
the scanner is configured to perform operations comprising:
alter the identified component of the modified magnetization, corresponding to the at least one short T2 species, by:
applying a hard 90° x pulse shorter than the short T2 to tip the identified component of the modified magnetization into 5 a transverse plane;
after each of a series of T2*-preparation time periods, applying a hard −90° x pulse shorter than the short T2 to restore the tipped magnetization to a longitudinal axis;
for each of the series of T2*-preparation time periods, detect a signal proportional to a T2*-relaxation of the altered magnetization; and
the data processor to identify a relaxation time, T2*, corresponding to the short T2 species, based on the detected signals.

20. The system of claim 7, wherein:
the scanner is configured to perform operations comprising:
alter the identified component of the modified magnetization, corresponding to the at least one short T2 species, by:
applying a hard 90° x pulse shorter than the short T2 to tip the identified component of the modified magnetization into a transverse plane;

applying a hard 180° x pulse shorter than the short T2 to refocus the tipped magnetization;

after each of a series of T2-preparation time periods, applying a hard −90° x pulse shorter than the short T2 to restore the refocused magnetization to a longitudinal axis;

for each of the series of T2-preparation time periods, detect a signal proportional to a transverse relaxation of the altered magnetization; and the data processor to identify a transverse relaxation time, T2, based on the detected signals.

21. The system of claim 7, wherein:

the scanner is configured to perform operations comprising:

alter the identified component of the modified magnetization, corresponding to the at least one short T2 species, by:

applying a hard 90° x pulse shorter than the short T2 to tip the identified component of the modified magnetization into 5 a transverse plane;

for each of a series of spin-locking time periods, applying a hard pulse to spin-lock the tipped magnetization;

applying a hard −90° x pulse shorter than the short T2 to restore the spin-locked magnetization to a longitudinal axis;

for each of the series of spin-locking time periods, detect a signal proportional to a T1ρ-relaxation of the altered magnetization; and the data processor to identify a relaxation time, T1ρ, based on the detected signals.

22. A method for nuclear magnetic resonance imaging (MRI), comprising:

applying to a sample a first radio frequency (RF) pulse at a first resonance frequency to adiabatically invert nuclear spins having the first resonance frequency and a first transverse relaxation rate;

applying to the sample a second RF pulse at a second resonance frequency to adiabatically invert nuclear spins having the second resonance frequency and a second transverse relaxation rate, wherein the nuclear spins having the first resonance frequency and the nuclear spins having the second resonance frequency simultaneously reach zero longitudinal magnetization states from inverted spin states due to longitudinal relaxation; and generating an image of at least part of the sample based on a magnetic resonance signal produced by a plurality of nuclear spins having one or more transverse relaxation rates that are faster than the first and second transverse relaxation rates.

23. The method of claim 22, further comprising:

acquiring the magnetic resonance signal with an ultrashort echo time (UTE) acquisition.

24. The method of claim 23, further comprising:

acquiring the magnetic resonance signal after a point in time when the nuclear spins having the first resonance frequency and the nuclear spins having the second resonance frequency have simultaneously reached zero longitudinal magnetization states from inverted spin states due to longitudinal relaxation.

* * * * *